US012757491B2

(12) United States Patent
Ozaki et al.

(10) Patent No.: US 12,757,491 B2
(45) Date of Patent: Oct. 6, 2026

(54) DISPLAY DEVICE

(71) Applicant: Magnolia White Corporation, Tokyo (JP)

(72) Inventors: Nobutaka Ozaki, Tokyo (JP); Yoshitaka Ozeki, Tokyo (JP); Koshiro Moriguchi, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 461 days.

(21) Appl. No.: 18/244,081

(22) Filed: Sep. 8, 2023

(65) Prior Publication Data

US 2024/0088164 A1 Mar. 14, 2024

(30) Foreign Application Priority Data

Sep. 12, 2022 (JP) ................................ 2022-144860

(51) Int. Cl.
*H10D 86/60* (2025.01)
*G02F 1/1343* (2006.01)
*G02F 1/1362* (2006.01)
*G02F 1/1368* (2006.01)
*H10D 86/40* (2025.01)

(52) U.S. Cl.
CPC ......... *H10D 86/60* (2025.01); *G02F 1/13439* (2013.01); *G02F 1/136209* (2013.01); *G02F 1/1368* (2013.01); *H10D 86/441* (2025.01)

(58) Field of Classification Search
CPC .. H10D 86/60; H10D 86/441; H10D 30/6723; H10D 86/423; H10D 86/451; H10D 86/471; G02F 1/13439; G02F 1/136209; G02F 1/1368; G02F 1/1362
See application file for complete search history.

(56) References Cited

U.S. PATENT DOCUMENTS 11,774,819 B2 * 10/2023 Miyamoto ......... H10D 30/6734 349/33
2011/0058116 A1 * 3/2011 Yamazaki ............ H10D 86/423 438/34
2014/0184964 A1 * 7/2014 Byeon ............... G02F 1/134309 349/138

(Continued)

FOREIGN PATENT DOCUMENTS

JP 2014-146819 A 8/2014
JP 2015-159315 A 9/2015

*Primary Examiner* — S M Sohel Imtiaz
(74) *Attorney, Agent, or Firm* — K&L Gates LLP

(57) ABSTRACT

A display device including a plurality of pixels arranged in a matrix on a substrate along a first direction and a second direction intersecting the first direction, wherein each of the plurality of pixels includes a transistor, a first transparent conductive layer arranged over the transistor and electrically connected to the transistor, a first insulating layer arranged over the first transparent conductive layer, a second transparent conductive layer arranged in the first insulating layer and electrically connected to the first transparent conductive layer via an opening extending over the plurality of pixels arranged in line in the first direction, a filling member arranged over the second transparent conductive layer to fill the interior of the opening, a third transparent conductive layer arranged on the first insulating layer and the filling member, and a metal layer in contact with the third transparent electrode.

5 Claims, 37 Drawing Sheets

(56) References Cited

U.S. PATENT DOCUMENTS

| | | | | |
|---|---|---|---|---|
| 2016/0062193 | A1* | 3/2016 | Yamayoshi | H10D 86/441<br>438/30 |
| 2017/0299908 | A1* | 10/2017 | Peng | G02F 1/13338 |
| 2018/0031877 | A1* | 2/2018 | Li | G02F 1/136209 |
| 2019/0056620 | A1* | 2/2019 | Akiyoshi | G02F 1/133512 |
| 2019/0346711 | A1* | 11/2019 | Yeh | G02F 1/136213 |
| 2022/0308378 | A1* | 9/2022 | Ozeki | H10D 86/60 |

* cited by examiner

DISPLAY DEVICE

CROSS-REFERENCE TO RELATED APPLICATIONS

This application claims the benefit of priority to Japanese Patent Application No. 2022-144860, filed on Sep. 12, 2022, the entire contents of which are incorporated herein by reference.

FIELD

An embodiment of the present invention relates to a display device. In particular, an embodiment of the present invention relates to a display device in which a transistor including an oxide semiconductor is used. Further, an embodiment of the present invention relates to an array substrate of a display device.

BACKGROUND

Recently, a transistor using an oxide semiconductor as a channel has been developed in place of an amorphous silicon, a low-temperature polysilicon, and a single-crystal silicon (e.g., Japanese laid-open patent publication No. 2014-146819 and Japanese laid-open patent publication No. 2015-159315). The transistor using the oxide semiconductor as the channel is formed in a simply structured, low-temperature process similar to a transistor using an amorphous silicon as a channel. It is known that the transistor using the oxide semiconductor as the channel has higher mobility than the transistor using the amorphous silicon as the channel and has a very low off-current.

SUMMARY

A display device according to an embodiment of the present invention includes a plurality of pixels arranged in a matrix on a substrate along a first direction and a second direction intersecting the first direction, wherein each of the plurality of pixels includes a transistor, a first transparent conductive layer arranged over the transistor and electrically connected to the transistor, a first insulating layer arranged over the first transparent conductive layer, a second transparent conductive layer arranged in the first insulating layer and electrically connected to the first transparent conductive layer via an opening extending over the plurality of pixels arranged in line in the first direction, a filling member arranged over the second transparent conductive layer to fill the interior of the opening, a third transparent conductive layer arranged on the first insulating layer and the filling member, and a metal layer in contact with the third transparent electrode.

A display device according to an embodiment of the present invention includes a plurality of pixels arranged in a matrix on a substrate along a first direction and a second direction intersecting the first direction, wherein each of the plurality of pixels includes a transistor, a first transparent conductive layer arranged over the transistor and electrically connected to the transistor, a first insulating layer arranged over the first transparent conductive layer, a second transparent conductive layer arranged in the first insulating layer and electrically connected to the first transparent conductive layer via an opening extending over the plurality of pixels arranged in line in the first direction, a second insulating layer arranged over the second transparent conductive layer, a third transparent conductive layer arranged over the second insulating layer, a filling member arranged over the third transparent conductive layer to fill the interior of the opening, and a metal layer in contact with the third transparent conductive layer and the filling member.

DESCRIPTION OF EMBODIMENTS

Figure 1:
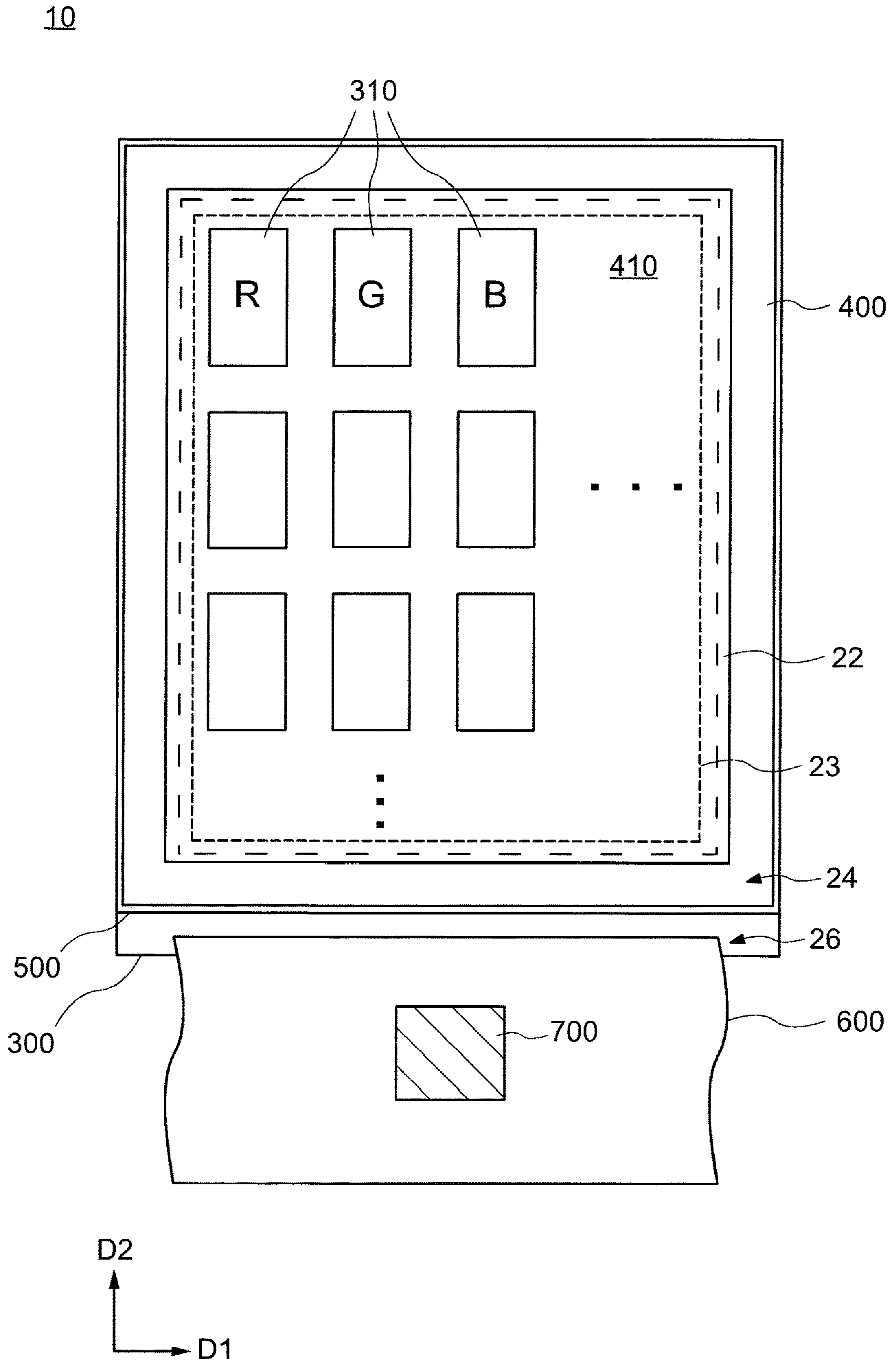
FIG. 1 is a plan view showing an outline of a display device according to an embodiment of the present invention.

As the pixel size of display devices shrinks, the distance between the pixel electrode and the signal line becomes shorter, and the pixel electrode is more susceptible to capacitive coupling by the signal line. The effect of crosstalk, in which the potential of the pixel electrode changes depending on the potential of the signal line, becomes more apparent.

An embodiment of the present invention reduces crosstalk in pixels with higher resolution in a display device.

Hereinafter, embodiments of the present invention are described with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later are described by exemplifying the liquid crystal display device including a liquid crystal layer as the display device, the structure in the present embodiment can be applied to a display device including the other electro-optical layers described above.

The expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where $\alpha$ includes other elements.

The following embodiments may be combined with each other as long as there is no technical contradiction.

First Embodiment

[1. Outline of Display Device 10]

An outline of a display device 10 according to an embodiment of the present invention is described with reference to FIG. 1 to FIG. 3. FIG. 1 is a plan view showing an outline of a display device according to an embodiment of the present invention. As shown in FIG. 1, a display device 10 includes an array substrate 300B, a seal part 400, a counter substrate 500, a flexible printed circuit substrate 600 (FPC 600), and an IC chip 700. The array substrate 300 and the counter substrate 500 are bonded by the seal part 400. In a liquid crystal region 22 surrounded by the seal part 400, a plurality of pixels 310 are arranged in a matrix along a first direction D1 (column direction) and a second direction D2 (row direction) intersecting the first direction D1. The plurality of pixels 310 include a red pixel R, a green pixel G, and a blue pixel B according to a color filter provided on the facing substrate. The first direction D1 and the second direction D2 may be orthogonal to each other. The liquid crystal region 22 is a region that overlaps the liquid crystal element 410 described later in a plan view. In the following description, the area including a plurality of pixels in the liquid crystal area 22 may be referred to as an image display area.

Further, the display device 10 has a backlight unit on the back of the array substrate 300, and when the light emitted from the backlight unit passes through the image display area, the transmitted light is modulated in each pixel 310 to display an image.

A seal area 24 provided with the seal part 400 is an area around the liquid crystal area 22. The FPC 600 is provided in a terminal area 26. The terminal area 26 is an area where the array substrate 300 is exposed from the counter substrate 500 and provided outside the seal area 24. The outside of the seal area 24 means outside of the area provided with the seal part 400 and the area surrounded by the seal part 400. The IC chip 700 is provided on the FPC 600. The IC chip 700 supplies a signal for driving the pixel circuit of each of the plurality of pixels 310. In the following description, the seal area 24, the outside of the seal area 24, and the terminal area 26 may be collectively referred to as a frame area

[2. Circuit Configuration of Display Device 10]

Figure 2:
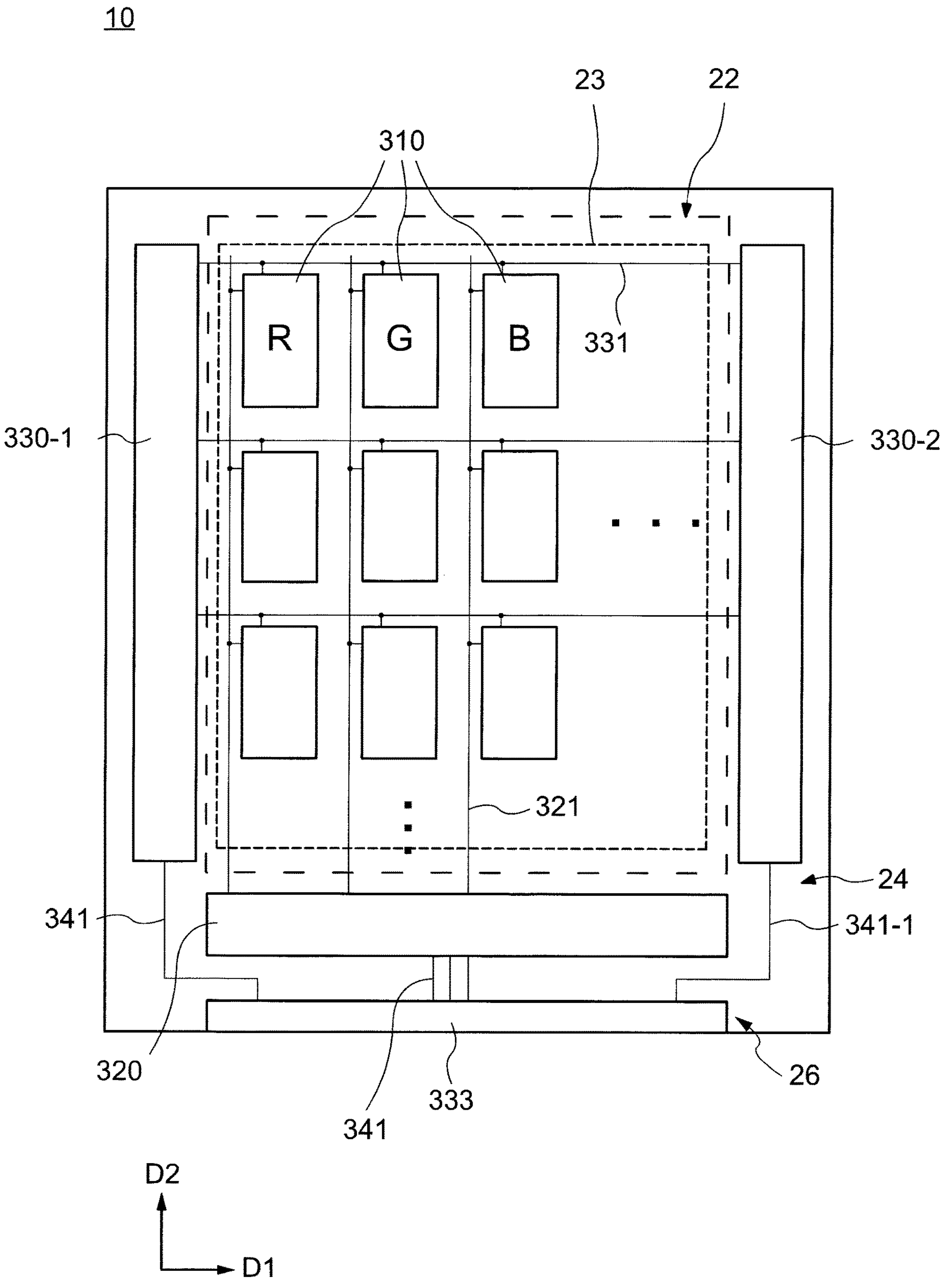
FIG. 2 is a block diagram showing a circuit configuration of a display device according to an embodiment of the present invention.

FIG. 2 is a block diagram showing a circuit configuration of a display device 10 according to an embodiment of the present invention. As shown in FIG. 2, a source driver circuit 320 and the liquid crystal area 22 where the pixel circuit 310 is arranged are adjacent in the direction D1, and the gate driver circuit 330B and the liquid crystal area 22 are adjacent in the direction D2. The source driver circuit 320 and the gate driver circuit 330 are provided in the seal area 24 described above. However, the area where the source driver circuit 320 and the gate driver circuit 330 are provided is not limited to the seal area 24, and it may be any area as long as it is outside the area provided with the pixel circuit 310.

A source wiring 321 extends in the direction D1 from the source driver circuit 320 and is connected to the multiple pixel circuits 310 arranged in the direction D1. A gate wiring 331 extends in the direction D2 from the gate driver circuit 330 and is connected to the multiple pixel circuits 310 arranged in the direction D2.

The terminal area 26 is provided with a terminal part 333. The terminal part 333 and the source driver circuit 320 are connected by connecting wirings 341. Similarly, the terminal part 333 and the gate driver circuit 330 are connected by the connecting wirings 341. An external device connected to the FPC 600 by connecting the FPC 600 to the terminal 333 and the display device 20 are connected, and each pixel circuit 310 provided in the display device 20 is driven by a signal from the external device.

[3. Pixel Circuit 310 of Display Device 10]

Figure 3:
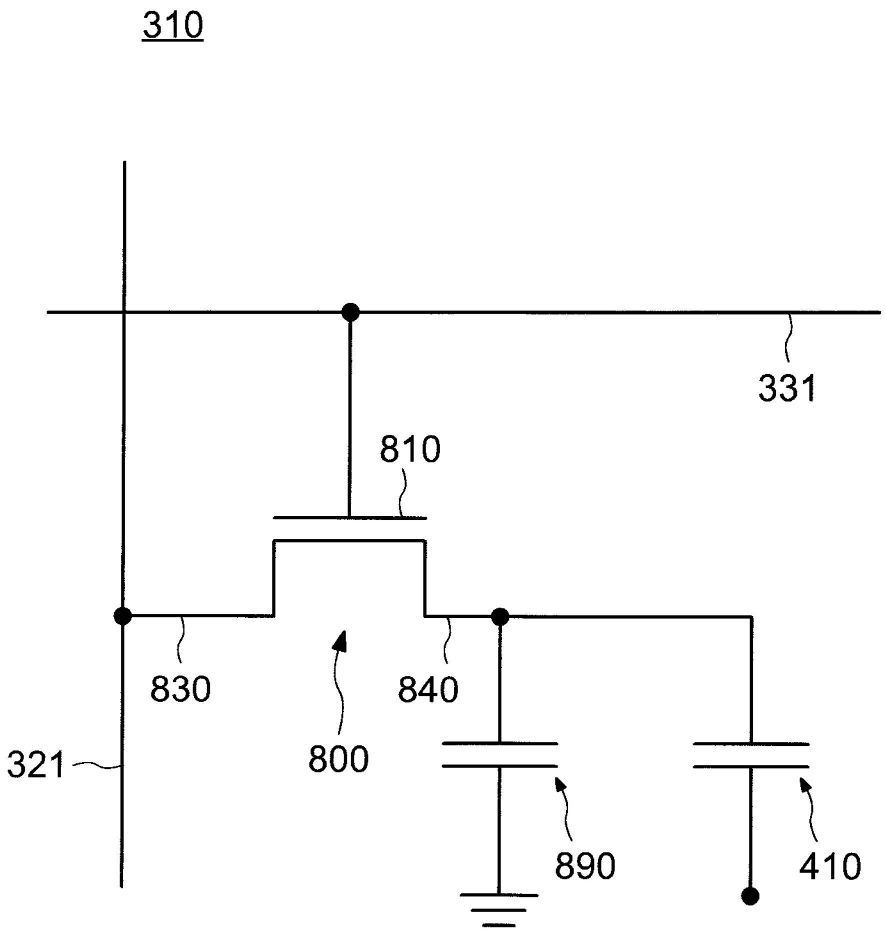
FIG. 3 is a circuit diagram showing a pixel circuit of a pixel of a display device according to an embodiment of the present invention.

FIG. 3 is a circuit diagram showing a pixel circuit of a display device 10 according to an embodiment of the present invention. As shown in FIG. 3, the pixel circuit 310 includes elements such as a transistor 800, a storage capacitor 890, and the liquid crystal element 410. One electrode of the storage capacitor 890 is the pixel electrode PTCO and the other electrode is the common electrode CTCO. Similarly, one electrode of the liquid crystal element 410 is the pixel electrode PTCO and the other electrode is the common electrode CTCO. The transistor 800 includes a first gate electrode 810, a first source electrode 830, and a first drain electrode 840. The first gate electrode 810 is connected to the gate wiring 331. The first source electrode 830 is connected to the source wiring 321. The first drain electrode 840 is connected to the storage capacitor 890 and the liquid crystal element 410. In the present embodiment, for convenience of explanation, although 830 is referred to as a source electrode and 840 is referred to as a drain electrode, the function of each electrode as a source and a drain may be interchanged.

[4. Configuration of Display Device 10]

Figure 4:
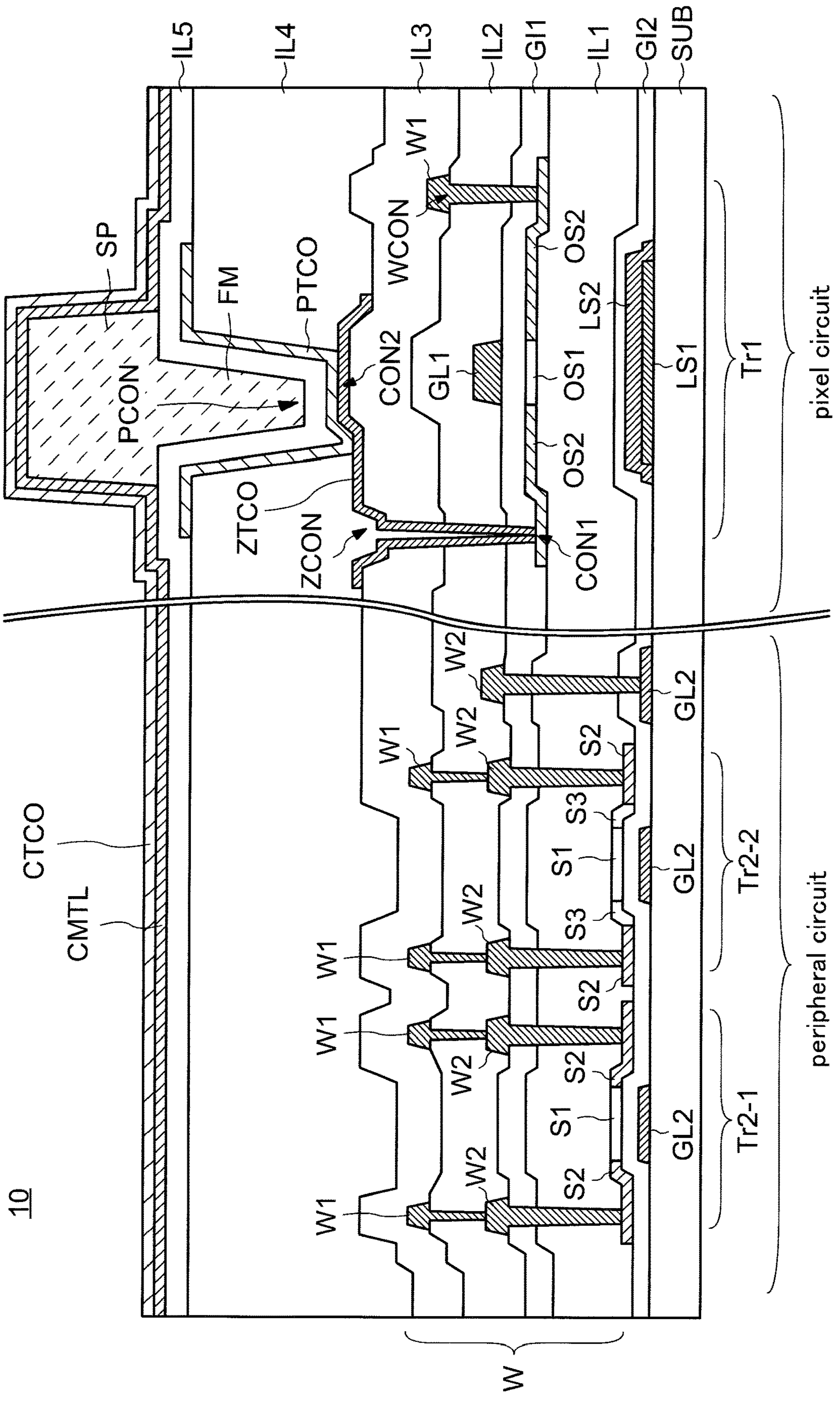
FIG. 4 is a cross-sectional view showing a configuration of a display device according to an embodiment of the present invention.
Figure 5:
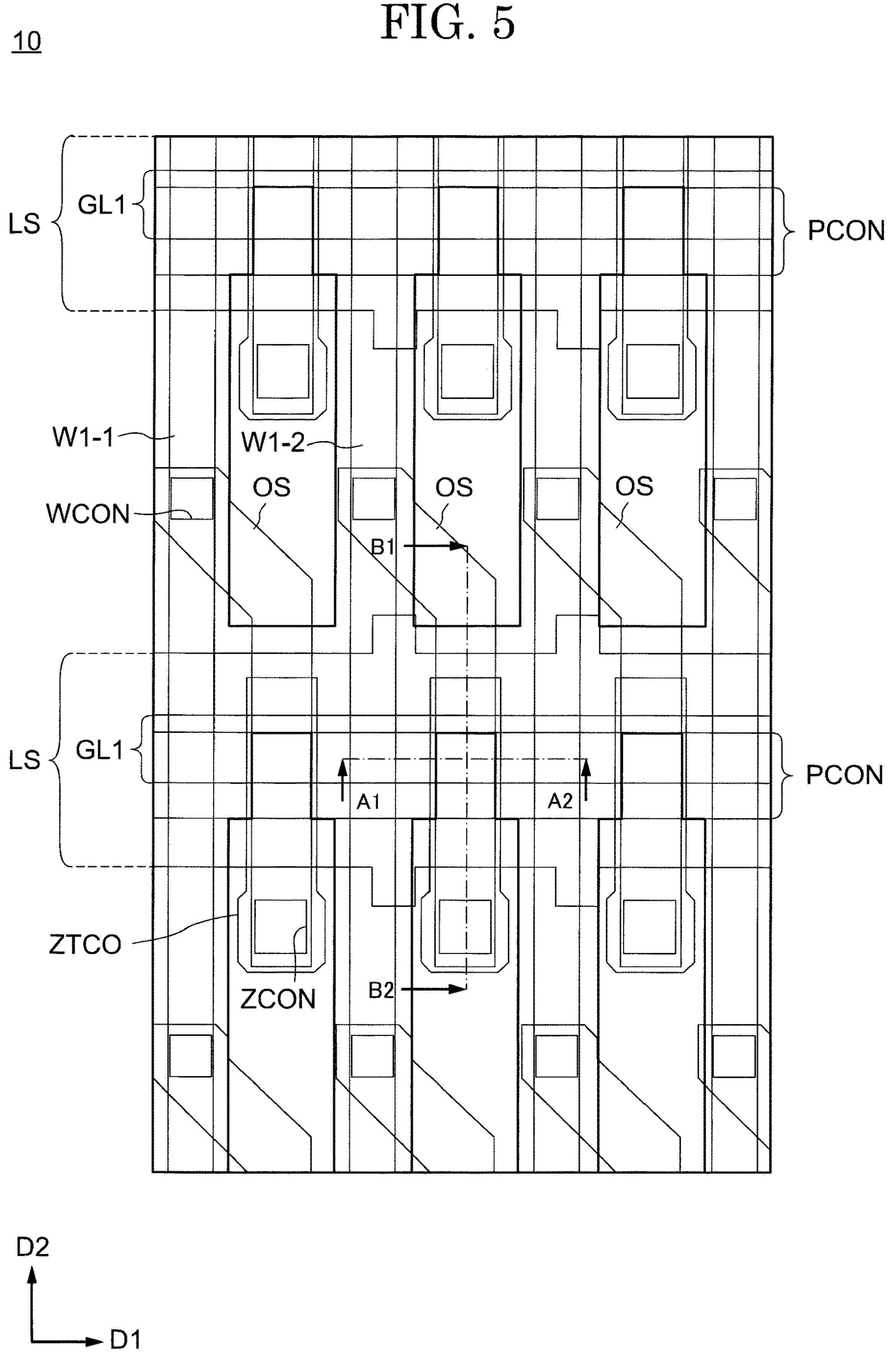
FIG. 5 is a plan view showing a configuration of a display device according to an embodiment of the present invention.
Figure 6:
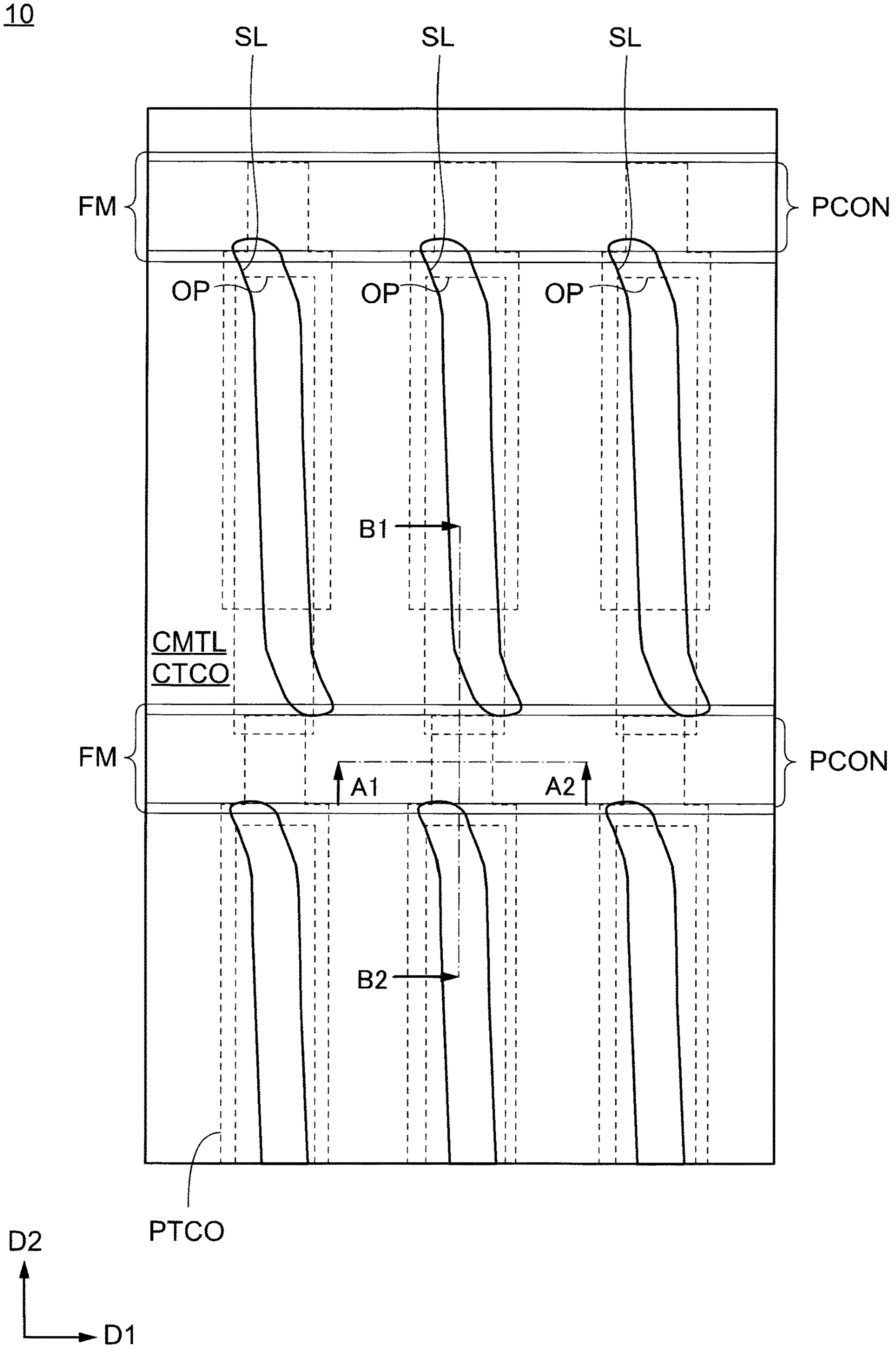
FIG. 6 is a plan view showing a configuration of a display device according to an embodiment of the present invention.
Figure 7:
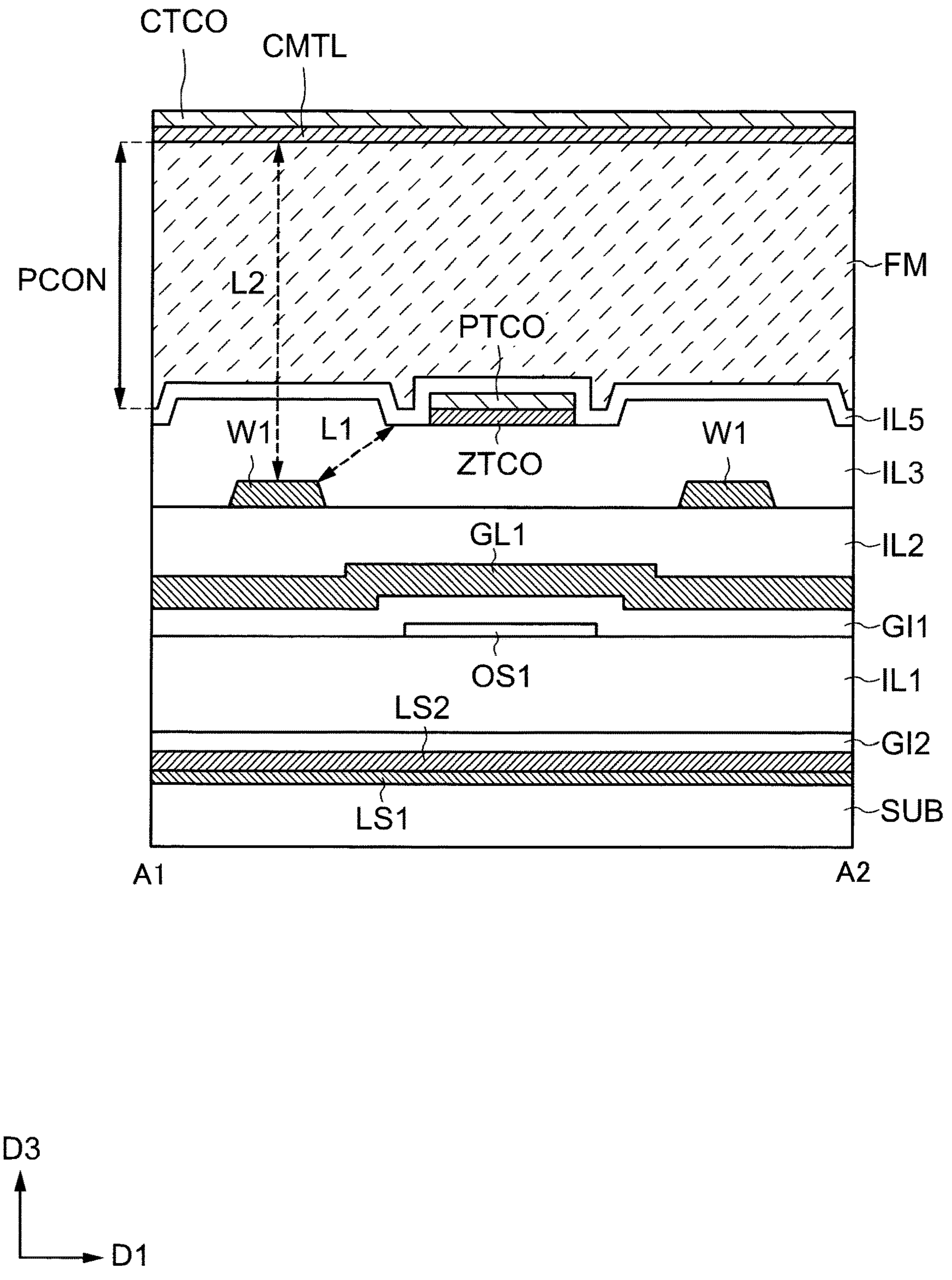
FIG. 7 is a cross-sectional view of the display device shown in FIG. 5 and FIG. 6 at the line A1-A2.
Figure 8:
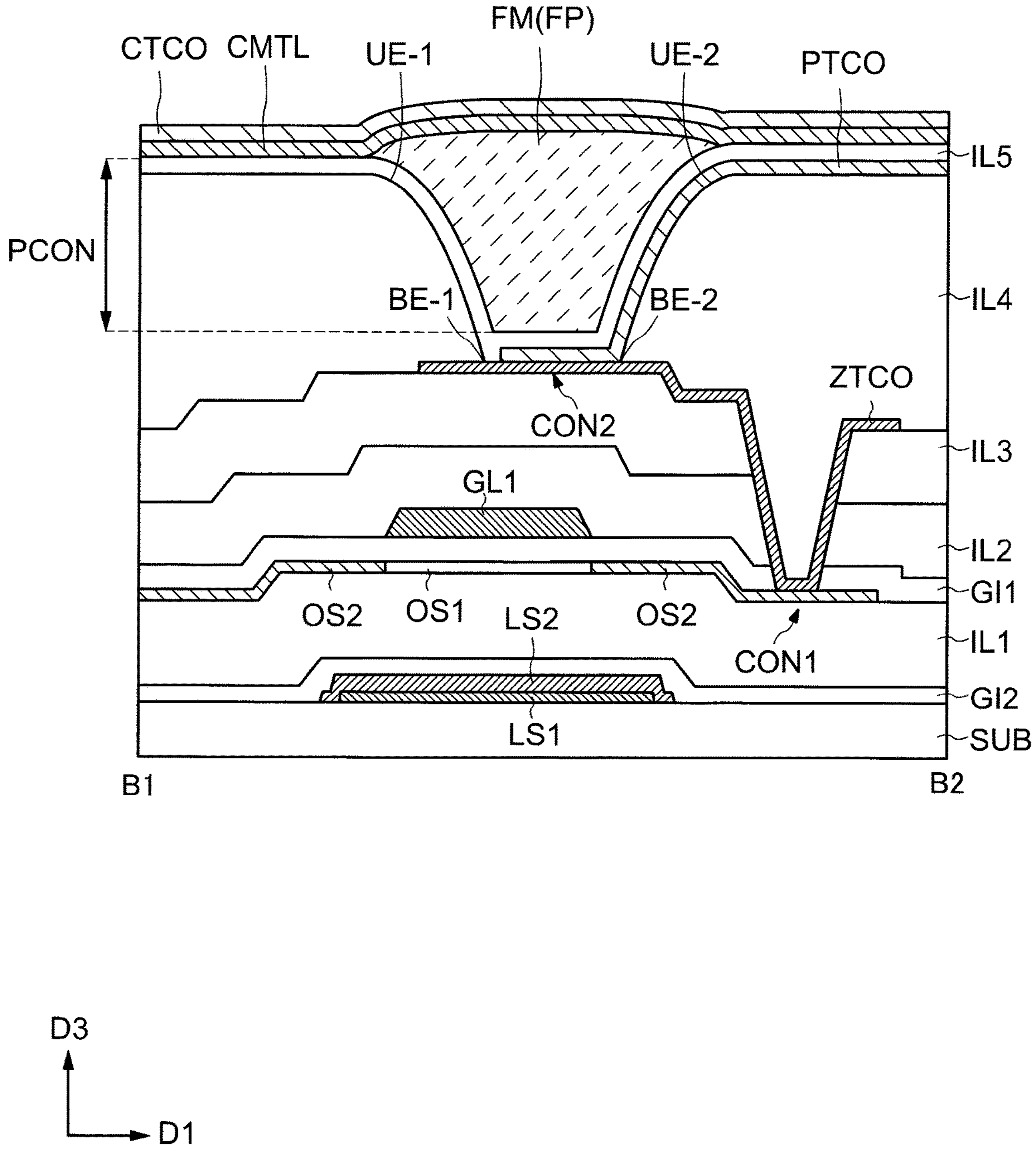
FIG. 8 is a cross-sectional view of the display device shown in FIG. 5 and FIG. 6 at the line B1-B2.
Figure 9:
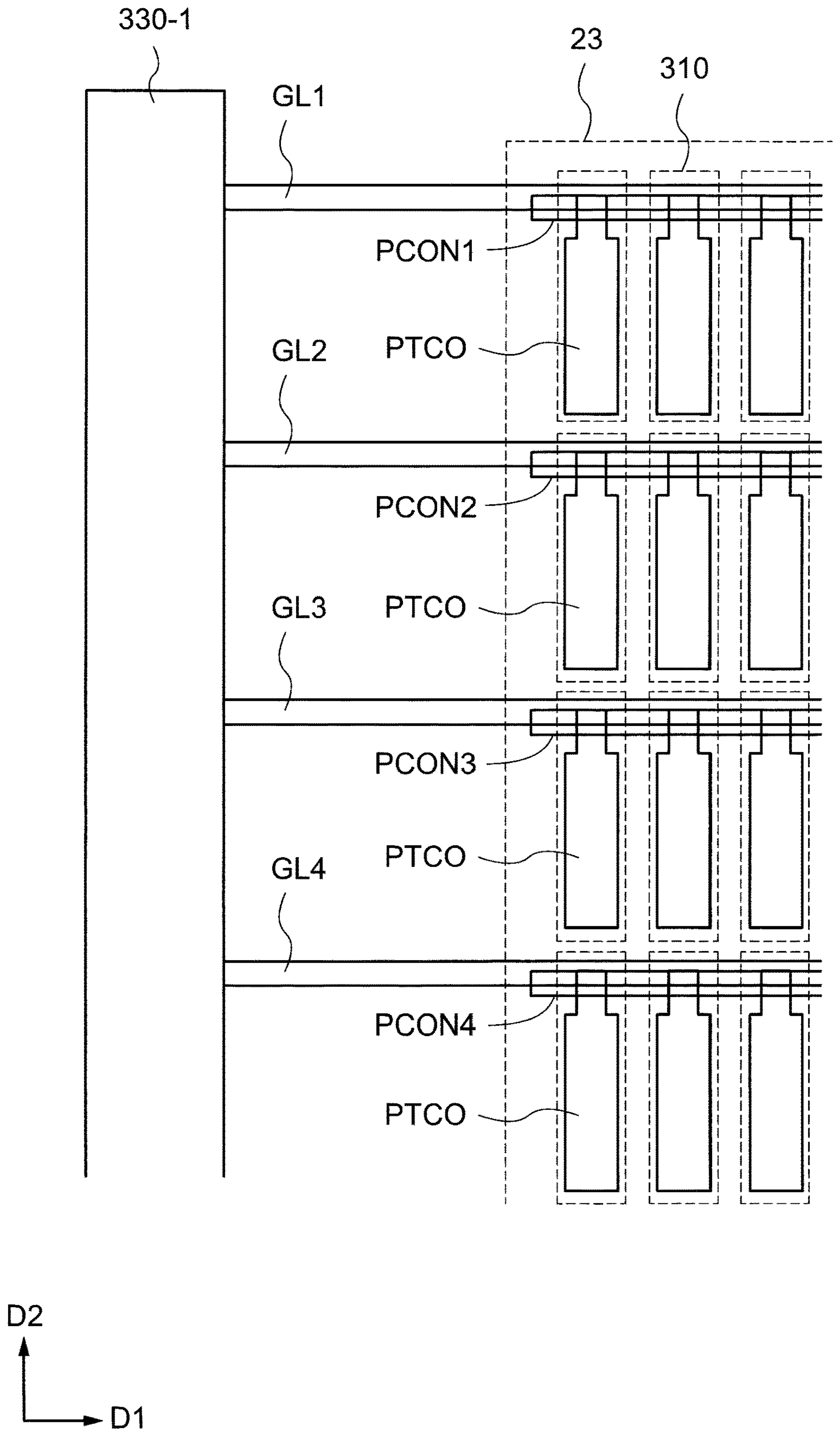
FIG. 9 is an enlarged schematic view of a boundary between the gate driver circuit and the image display area.

The details of a configuration of the display device 10 according to the embodiment of the present invention is described with reference to FIG. 4 to FIG. 20. FIG. 4 is a cross-sectional view showing the configuration of the display device 10 according to the embodiment of the present invention. FIG. 5 and FIG. 6 are plan views showing the configuration of the display device 10 according to the embodiment of the present invention. FIG. 7 is a cross-sectional view of the display device shown in FIG. 5 and FIG. 6 at the line A1-A2. FIG. 8 is a cross-sectional view of the display device shown in FIG. 5 and FIG. 6 at the line B1-B2. FIG. 9 is an enlarged schematic view of a boundary between the gate driver circuit and the image display area. FIG. 10 to FIG. 21 are plan views showing the layout of each layer in the display device 10 according to the embodiment of the present invention. The cross-sectional view of FIG. 4 is for explaining the layer structure of the display device 10, and the peripheral circuit and the pixel circuit are shown adjacent to each other. Needless to say, however, the pixel circuit is provided in the image display area and the peripheral circuits are provided in the frame area outside the image display area, and these circuits are provided apart from each other. Further, in particular, in the pixel circuit in FIG. 4, the peripheral portion of a contact hole in the pixel is mainly shown, and only a part of the translucent area (opening area) that contributes to the display is shown.

As shown in FIG. 4, the display device 10 includes a substrate SUB. The display device 10 also includes a transistor Tr1, a transistor Tr2, a wiring W, a connecting electrode ZTCO, a pixel electrode PTCO, a common auxiliary electrode CMTL, and a common electrode CTCO on the substrate SUB. TCO is an abbreviation for Transparent Conductive Oxide. The transistor Tr1 is a transistor included in the pixel circuit of the pixel 310 in the display device 10. The transistor Tr2 is a transistor included in a peripheral circuit such as the source driver circuit 320 or the gate driver circuit 330.

[5. Configuration of Transistor Tr1]

The transistor Tr1 includes an oxide semiconductor layer OS, a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB than the gate electrode GL1 is exemplified, a bottom gate type transistor in which a positional relationship between the gate electrode GL1 and the oxide semiconductor layer OS is reversed may be applied.

The oxide semiconductor layer OS includes oxide semiconductor regions OS1 and OS2. The oxide semiconductor region OS1 is an oxide semiconductor in a region overlapping the gate electrode GL1 in a plan view. The oxide semiconductor region OS1 functions as a semiconductor and is switched between a conductive state and a non-conductive state according to a voltage supplied to the gate electrode GL1. That is, the oxide semiconductor region OS1 functions as a channel for the transistor Tr1. The oxide semiconductor region OS2 functions as a conductor. The oxide semiconductor regions OS1 and OS2 are regions formed from the same oxide semiconductor layer. For example, the oxide semiconductor region OS2 is a low resistance oxide semiconductor region formed by doping impurities into a region which has the same physical properties as the oxide semiconductor region OS1.

An insulating layer IL2 is provided above the gate electrode GL1. A wiring W1 is provided above the insulating layer IL2. The wiring W1 is connected to the oxide semiconductor region OS2 via an opening WCON provided in the insulating layer IL2 and the gate insulating layer GI1. A data signal related to pixel gradation is transmitted to the wiring W1. An insulating layer IL3 is provided above the insulating layer IL2 and the wiring W1. The connecting electrode ZTCO is provided above the insulating layer IL3. The connecting electrode ZTCO is connected to the oxide semiconductor region OS2 via an opening ZCON provided in the insulating layers IL3, IL2, and the gate insulating layer GI1. The connecting electrode ZTCO is in contact with the oxide semiconductor region OS2 at the bottom of the opening ZCON. The connecting electrode ZTCO is a transparent conductive layer.

The area where the connecting electrode ZTCO (also called a first transparent conductive layer) and the oxide semiconductor region OS2 contact is called the first contact area CON1. As described in detail below, the first transparent conductive layer contacts the oxide semiconductor region OS2 in the first contact area CON1, which does not overlap on the gate electrode GL1 and the wiring W1 in a plan view. The first contact area CON1 is included in the display area of the pixel in a plan view.

For example, when a transparent conductive layer such as an ITO layer is formed in contact with a semiconductor layer such as a silicon layer, a surface of the semiconductor layer is oxidized by a process gas or oxygen ions at the time of a deposition of an ITO film. Since an oxide layer formed on the surface of the semiconductor layer is high resistance, a contact resistance between the semiconductor layer and the transparent conductive layer is increased. Therefore, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. The insulating layer IL4 eases (flattens) a step formed from a structure provided below the insulating layer IL4. The insulating layer IL4 may be referred to as a planarization film. The pixel electrode PTCO (also called a second transparent conductive layer) is provided above the insulating layer IL4.

The pixel electrode PTCO is connected to the connecting electrode ZTCO via an opening PCON (also called a contact hole) provided in the insulating layer IL4. An area where the connecting electrode ZTCO and the pixel electrode PTCO are in contact with each other is referred to as a second contact area CON2. The second contact area CON2 overlaps the gate electrode GL1 in a plan view. The pixel electrode PTCO is a transparent conductive layer.

As shown in FIG. 5, the opening PCON is provided in the insulating layer IL4 and extends over the plurality of pixels arranged in line in the first direction D1 among a plurality of pixels arranged in the matrix. The opening PCON is provided so that it overlaps on the gate wiring GL1 along the first direction D1.

An insulating layer IL5 is arranged above the pixel electrode PTCO and the insulating layer IL4. The insulating layer IL5 is arranged inside the opening PCON, on the side surface of the opening PCON and also on the pixel electrode PTCO. A filling member FM is arranged above the insulating layer IL5 to fill the interior of the opening PCON. Since the opening PCON is arranged extending in the first direction D1, the filling member FM is also arranged extending in the first direction D1. In the region where the filling member FM is arranged, the filling member FM has a protruding portion protruding above the top surface of the pixel electrode PTCO arranged above the insulating layer IL4. The protruding portion functions as a spacer SP. The portion of the filling member FM that is roughly coincident with the top surface of the pixel electrode PTCO arranged on the insulating layer IL4 or the top surface of the insulating layer IL5 arranged on the insulating layer IL4 is also referred to as the filling portion.

The spacer SP is provided for a part of the pixels. For example, the spacer SP may be provided for any one of a blue pixel, a red pixel and a green pixel. However, the spacer SP may be provided for all the pixels. A height of the spacer SP is half the height of a cell gap. A spacer is also provided on a counter substrate, and the spacer on the counter substrate and the above spacer SP overlap in a plan view. A configuration in which the height of the spacer SP is equal to the cell gap can also be applied. The detailed configuration of the spacer SP will be described in detail later.

As shown in FIG. 6, a common auxiliary electrode CMTL and a common electrode CTCO (also called a third transparent conductive layer) are provided on the filling member FM. The common electrode CTCO is provided in contact with the common auxiliary electrode CMTL. The common auxiliary electrode CMTL is provided in contact with the filling member FM. The common auxiliary electrode CMTL and the common electrode CTCO have different planar patterns. The common auxiliary electrode CMTL is a metal layer. The common electrode CTCO is a transparent conductive layer. The electrical resistance of the common auxiliary electrode CMTL is lower than that of the common electrode CTCO. The common auxiliary electrode CMTL also functions as a light-shielding layer. For example, the common auxiliary electrode CMTL shields light from adjacent pixels, thereby suppressing the occurrence of color mixing. In FIG. 4, the configuration in which the common auxiliary electrode CTCO is provided on top of the common auxiliary electrode CMTL is shown.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. That is, in a plan view, the light-shielding layer LS is provided in an area overlapping the oxide semiconductor region OS1. The light-shielding layer LS suppresses the light incident from the substrate SUB side from reaching the oxide semiconductor region OS1. In the case where a conductive layer is used as the light-shielding layer LS, a voltage may be applied to the light-shielding layer LS to control the oxide semiconductor region OS1. In the case where a voltage is applied to the light-shielding layer LS, the light-shielding layer LS and the gate electrode GL1 may be connected by a peripheral area of the pixel circuit. In a plan view, the above first contact area CON1 is provided in an area not overlapping the light-shielding layer LS. The light-shielding layer LS extends in the first direction D1 so that it is overlaps on the opening PCON.

[6. Configuration of Transistor Tr2]

FIG. 4 shows a p-type transistor Tr2-1 and an n-type transistor Tr2-2 in the peripheral circuit.

The p-type transistor Tr2-1 and the n-type transistor Tr2-2 both include a gate electrode GL2, a gate insulating layer GI2, and a semiconductor layer S (S1 and S2, or S1, S2 and S3). The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified, a top gate type transistor in which a positional relationship between the semiconductor layer S and the gate electrode GL2 is reversed may be used as the display device.

The semiconductor layer S of the p-type transistor Tr2-1 includes semiconductor areas S1 and S2. The semiconductor layer S of the n-type transistor Tr2-2 includes the semiconductor regions S1, S2 and S3. The semiconductor area S1 is a semiconductor layer overlapping the gate electrode GL2 in a plan view. The semiconductor regions S1 functions as a channel for the transistors Tr2-1 and Tr2-2. The semiconductor region S2 functions as a conductor. The semiconductor region S3 functions as a conductive layer with a higher resistance than the semiconductor region S2. The semiconductor region S3 suppresses hot carrier degradation by attenuating hot carriers intruding toward the semiconductor region S1.

An insulating layer IL1 and the gate insulating layer GI1 are provided on the semiconductor layer S. In the transistor Tr2, the gate insulating layer GI1 simply functions as an interlayer film. A wiring W2 is provided above these insulating layers. The wiring W2 is connected to the semiconductor layer S via an opening provided in the insulating layer IL1 and the gate insulating layer GI1. The insulating layer IL2 is provided on the wiring W2. The wiring W1 is provided on the insulating layer IL2. The wiring W1 is connected to the wiring W2 via an opening (also called a contact hole) provided in the insulating layer IL2.

The gate electrode GL2 and the light-shielding layer LS2 are the same layer. The wiring W2 and the gate electrode GL1 are the same layer. The same layer means that multiple members are formed from one patterned layer.

[7. Effect of Parasitic Capacitance]

Figure 35:
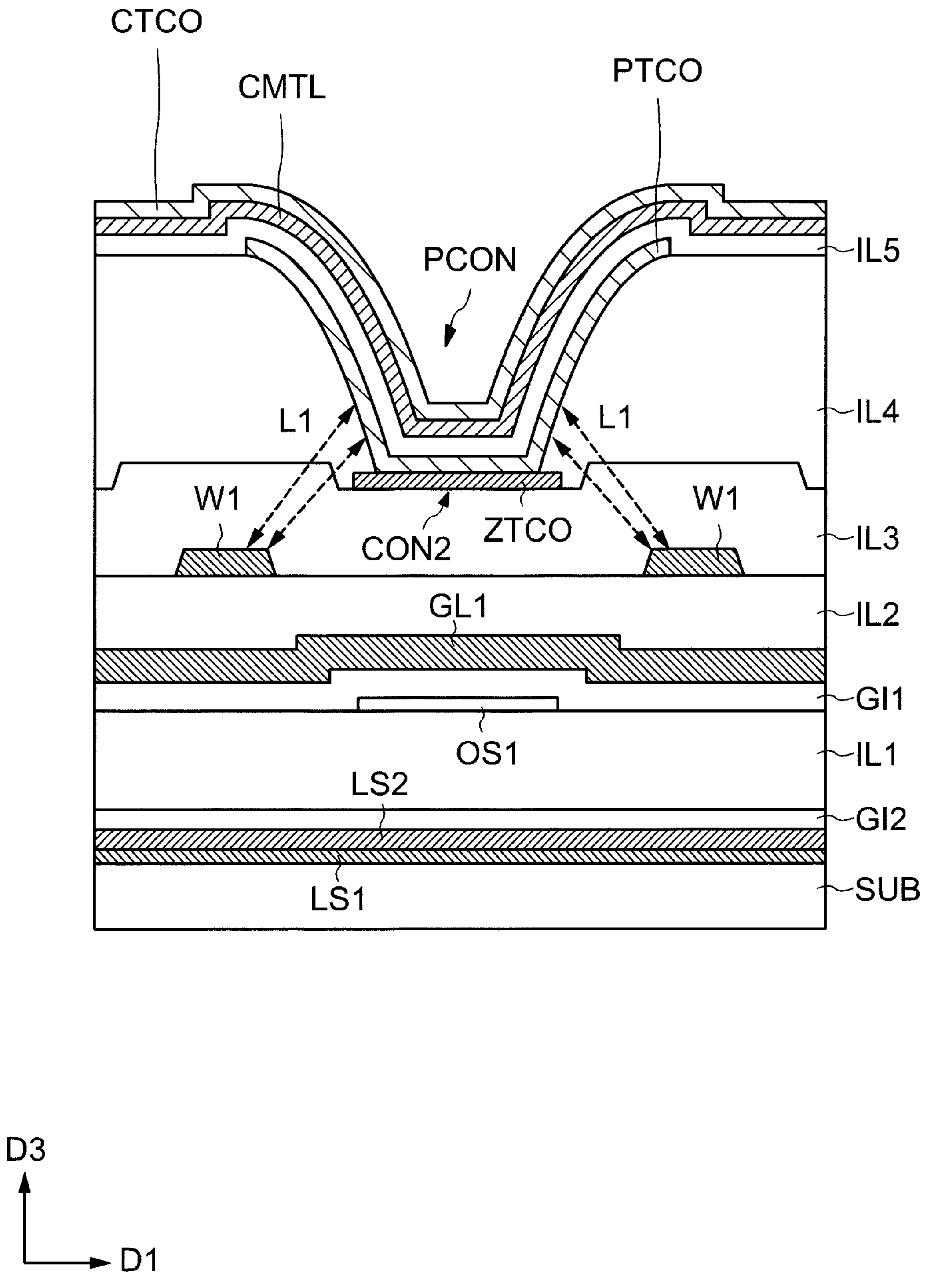
FIG. 35 is a cross-sectional view of a display device of a comparative example.
Figure 36:
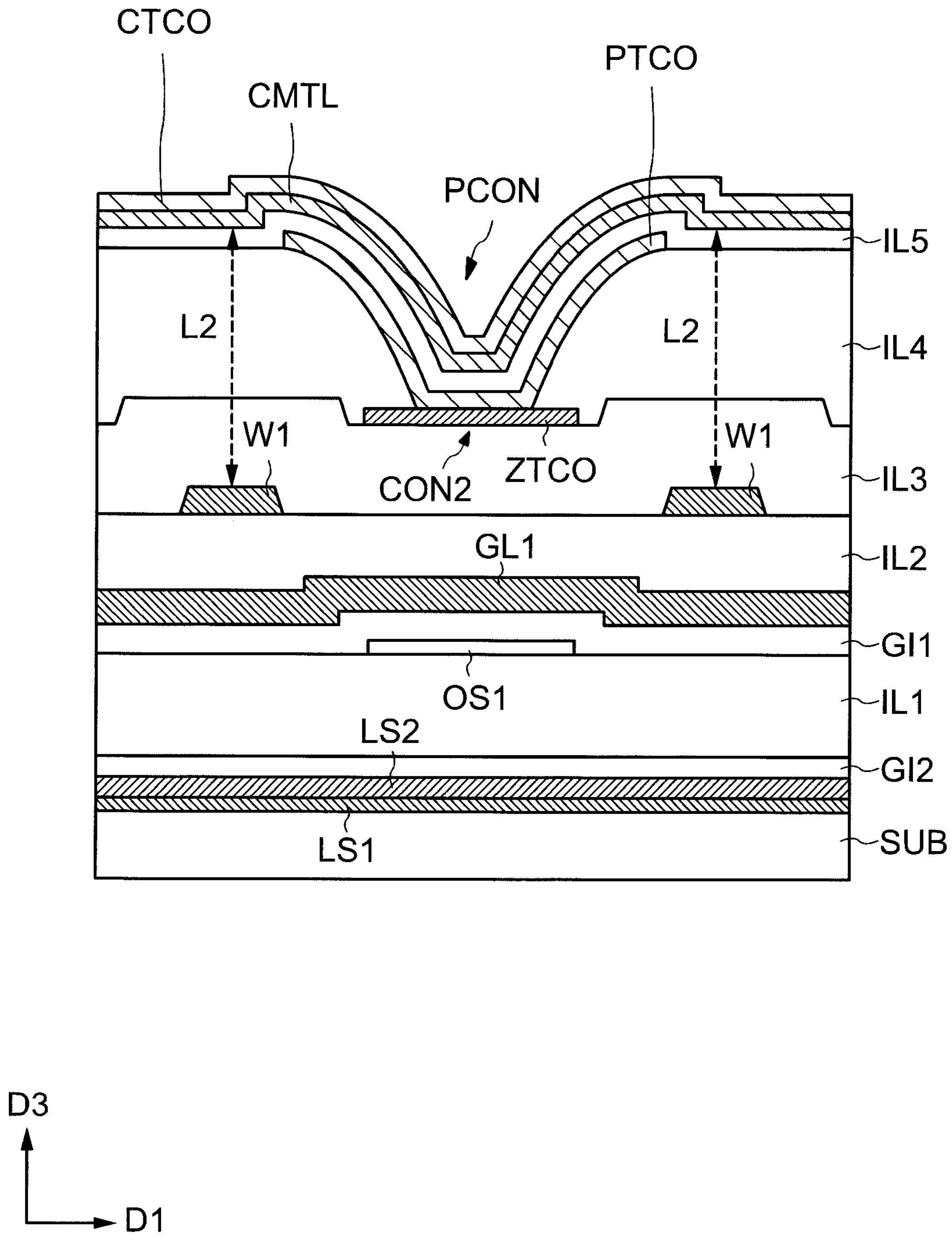
FIG. 36 is a cross-sectional view of a display device of a comparative example.
Figure 37:
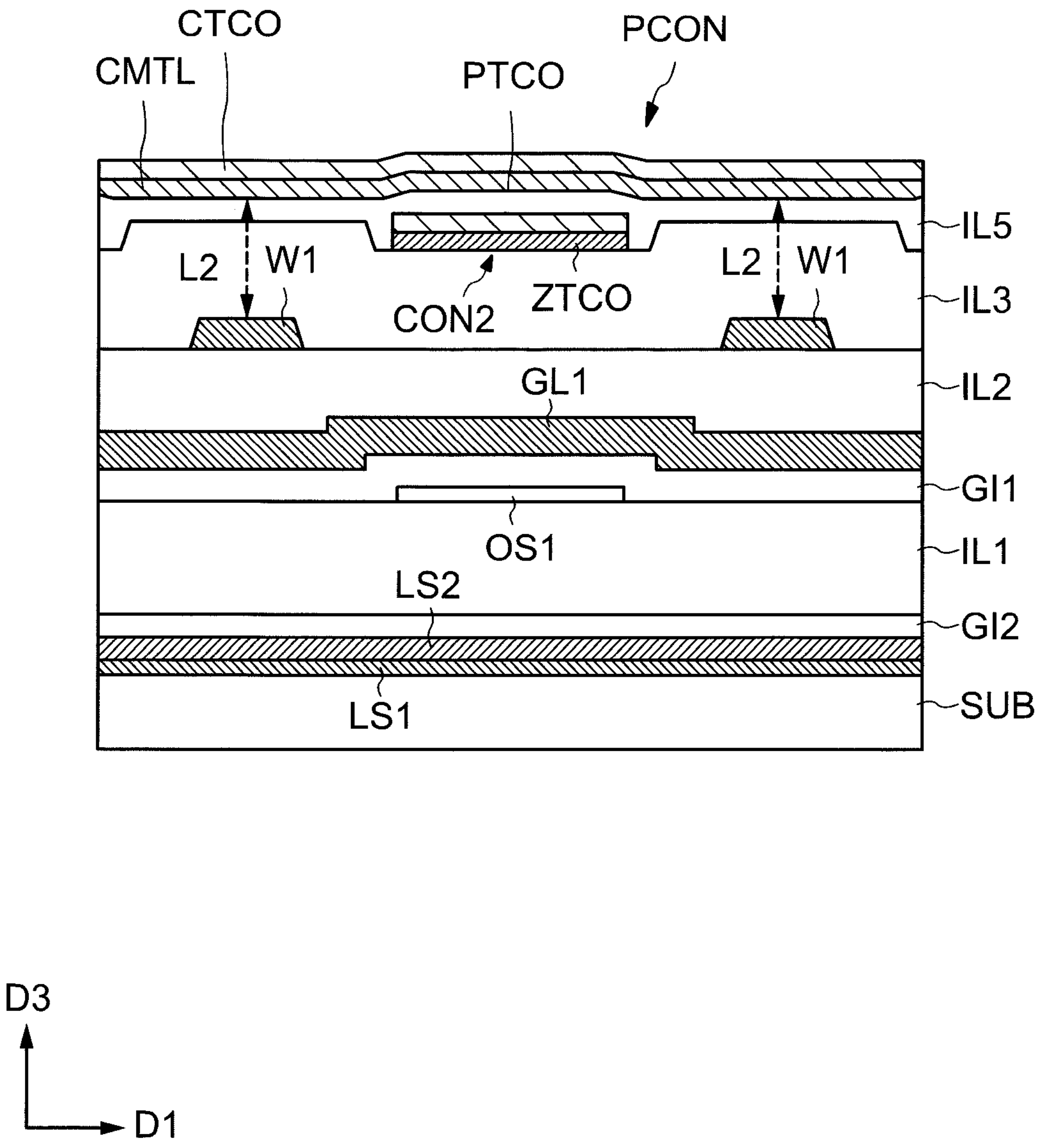
FIG. 37 is a cross-sectional view of the display device of the comparative example.

With reference to FIG. 35 to FIG. 37, the effect of parasitic capacitance formed by the wiring W1, the pixel electrode PTCO, and the common electrode CTCO is explained. FIG. 35 to FIG. 37 show the second contact area CON2, where the connecting electrode ZTCO and the pixel electrode PTCO are in contact, cut along the first direction D1. High-resolution display with an increased number of pixels is desired in display devices such as head-mounted displays. In increasing the pixel resolution, parasitic capacitance formed between the wiring W1 and the pixel electrode PTCO (see FIG. 35) and between the wiring W1 and the common electrode CTCO (see FIG. 36) becomes a problem.

To reduce the parasitic capacitance formed between the wiring W1 and the common electrode CTCO, the distance between the wiring W1 and the common electrode CTCO should be increased. In this case, the insulating layer IL4 should be thickened. However, if the insulating layer IL4 is thickened, the hole diameter of the contact hole (especially the hole diameter on the top surface of the insulating layer IL4) tends to become larger. Due to this effect, as shown in FIG. 35, the hole diameter of the opening PCON widens, and the distance L1 between the wiring W1 and the pixel electrode PTCO covering the side of the opening PCON in the first direction D1 becomes closer, resulting in a non-negligible parasitic capacitance. If the pixel is driven at high speed under such conditions, the load increases between the wiring W1 and the pixel electrode PTCO, resulting in an increase in power consumption.

To reduce the parasitic capacitance formed between the wiring W1 and the pixel electrode PTCO, the distance between the wiring W1 and the pixel electrode PTCO should be increased. In this case, the hole diameter of the contact hole can be reduced, but to reduce the hole diameter of the contact hole, the film thickness of the insulating layer IL4 must be reduced. Due to this effect, the distance L2 between the wiring W and the common electrode CTCO in the third direction D3 becomes closer, as shown in FIG. 36, and the parasitic capacitance is formed. When attempting to drive the pixel at high speed in such a state, the potential of the pixel electrode PTCO becomes higher than the original potential due to the capacitive coupling associated with the parasitic capacitance, which is caused by the potential of the wiring W1. This causes crosstalk that changes in the display device and degrades the display quality of the display device.

Thus, to improve the pixel resolution, there are restrictions on the shape of the contact holes for connecting the connecting electrode ZTCO and the pixel electrode PTCO. Therefore, in this embodiment, the contact holes for connecting the connecting electrode ZTCO and the pixel electrode PTCO are provided to extend along the first direction D1 as contact grooves. In this case, various restrictions described above caused by providing individual contact holes for each pixel are eliminated, and a higher pixel resolution becomes possible. On the other hand, as shown in FIG. 37, a contact groove is also formed on the wiring W1 so that the distance L2 between the wiring W1 and the common electrode CTCO becomes closer within the contact groove. As a result, a parasitic capacitance is formed between the wiring W1 and the common electrode CTCO.

As explained above, to achieve higher pixel resolution, it is necessary to suppress the formation of the parasitic capacitance caused by the contact hole connecting the connecting electrode ZTCO and the pixel electrode PTCO.

FIG. 7 is a cross-sectional view of the display device shown in FIG. 5 and FIG. 6 at the line A1-A2. FIG. 8 is a cross-sectional view of the display device shown in FIG. 5 and FIG. 6 at the line B1-B2. As shown in FIG. 7, a contact hole (the opening PCON) is provided in the insulating layer IL4 to connect the connecting electrode ZTCO and the pixel electrode PTCO, extending along the first direction D1. The opening PCON is a groove (also called an opening groove or contact groove) extending along the first direction D1. As shown in FIG. 7 and FIG. 8, the filling member FM is provided to fill the interior of the opening PCON. Furthermore, the common auxiliary electrode CMTL and the common electrode CTCO are provided above the insulating layer IL4 and the filling member FM.

As shown in FIG. 6, the opening PCON is provided to extend along the first direction D1. As a result, as shown in FIG. 7, there is no insulating layer IL4 above the wiring W1 that functions as a signal line in the opening PCON. This provides a configuration in which the pixel electrode PTCO is not located on the side of the opening PCON, so that the wiring W1 and the pixel electrode PTCO are not in close proximity. As a result, it is possible to suppress the formation of parasitic capacitance by the wiring W1 and the pixel electrode PTCO at the side surface of the opening PCON. The thickness of the insulating layer IL4 is not particularly limited because the hole diameter of the opening PCON is no longer restricted. The common auxiliary electrode CMTL and the common electrode CTCO are provided above the filling member FM. Therefore, the formation of parasitic capacitance between the wiring W1 and the common electrode CTCO above the wiring W1 can be suppressed.

The insulating layer IL4 is formed using an organic insulating material. As shown in FIG. 8, upper ends UE-1 and UE-2 of the opening PCON in the insulating layer IL4 are curved. The filling material FM is filled to the vicinity of the upper ends UE-1 and UE-2 of the opening PCON. The filling material FM may be heaped to cover more than the upper ends UE-1 and UE-2 of the opening PCON. The width of the opening PCON refers to the length from a bottom end BE-1 to a bottom end BE-2 of the insulating layer IL4 in the second direction D2.

The display device 10 according to an embodiment of the present invention provide the connection between the pixel electrode PTCO and the connecting electrode ZTCO without reducing the thickness of the insulating layer IL4. In addition, the parasitic capacitance formed by the wiring W and the common electrode CTCO and the parasitic capacitance formed by the wiring W and the pixel electrode PTCO can be suppressed. Along with this, restrictions on the dimensions of contact holes and the distance between contact holes in the first direction D1 can be eliminated. As a result, as a high-resolution display device can be obtained, the influence of crosstalk can be reduced and the consumption electrode can be suppressed from increasing.

[8. Shape of Opening PCON]

FIG. 9 is an enlarged schematic view of a boundary between the gate driver circuit 330-1 and the image display area 23. In FIG. 9, a plurality of pixels 310 are provided in the image display area 23. FIG. 9 shows the gate driver circuit 330-1, the gate electrodes GL1 to GL4, the openings PCON1 to PCON4, and the pixel electrode PTCO. In FIG. 9, the oxide semiconductor layer OS, a conductive layer, a transparent conductive layer, and an insulating layer other than the pixel electrode PTCO and the gate wiring GL are omitted. The gate driver circuits 330-1 and 330-2 are provided along the second direction D2. The gate wiring GL extends along the first direction D1.

The gate driver circuit 330-1 controls the drive of the plurality of pixels 310 via the gate electrodes GL1 to GL4. Each of the openings PCON1 to PCON4 extends over a plurality of pixels arranged in a matrix and extending in the first direction. The opening PCON extends along the first direction D1 so as to overlap on the gate wiring GL. The ends of the openings PCON1 to PCON4 may be provided to the edge of the image display area 23. Although not shown in the figure, the ends of the opening PCON may be provided to the edge of the image display area 23 on the gate driver circuit 330-2 side. The opening PCON may be provided continuously from the edge of the image display area 23 on the gate driver circuit 330-1 side to the edge of the image display area 23 on the gate driver circuit 330-2 side. Alternatively, the openings PCON may be divided and provided for each of a plurality of pixels 310 arranged along the first direction D1.

[9. Plane Layout of Display device 10]

A plane layout of a pixel of the display device 10 is described with reference to FIG. 10 to FIG. 21. FIG. 10 to FIG. 21 show the plane layout of the pixel when the spacer SP is not provided.

Figure 10:
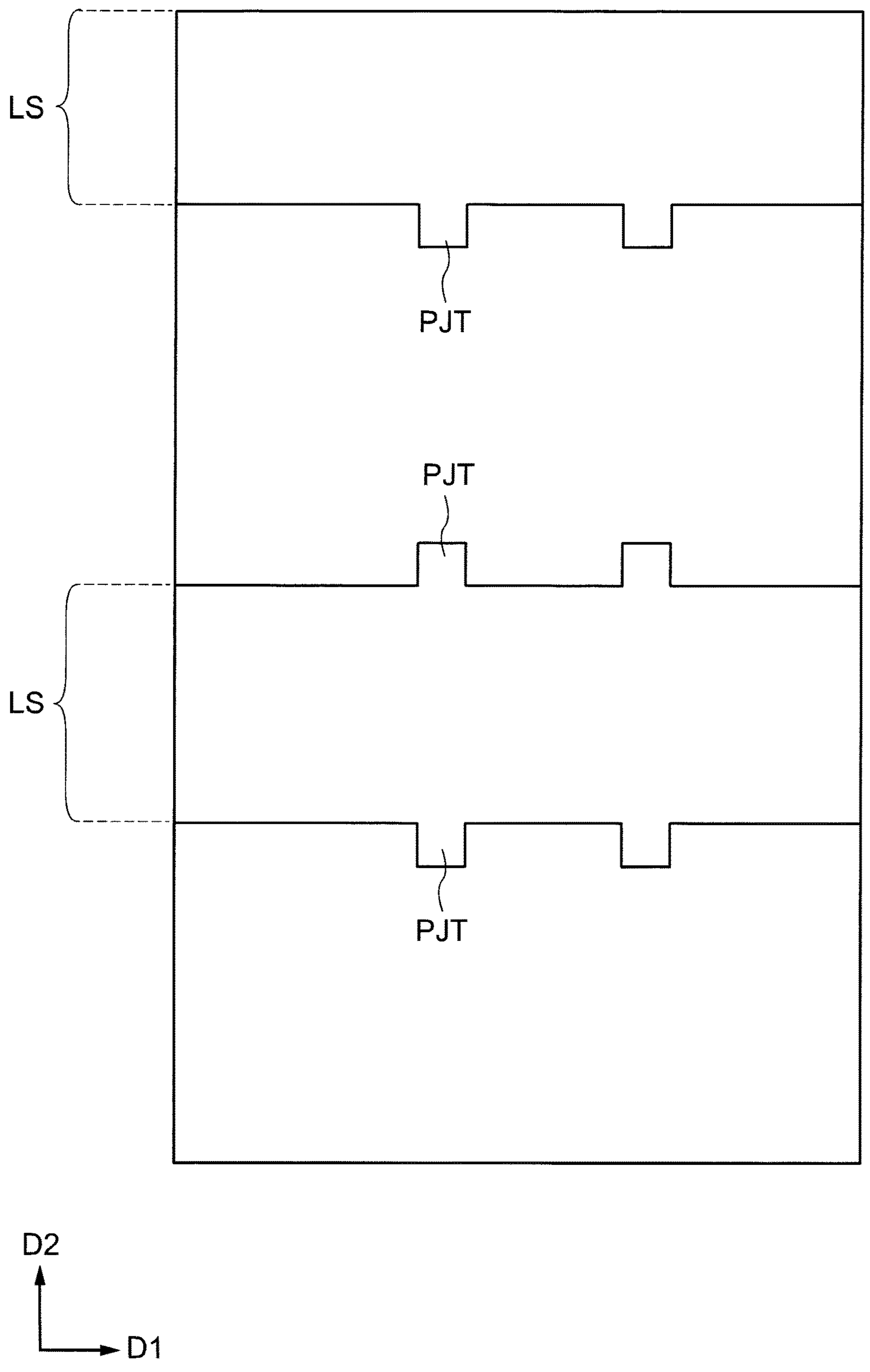
FIG. 10 is a plan view showing a layout of each layer in a display device according to an embodiment of the present invention.
Figure 12:
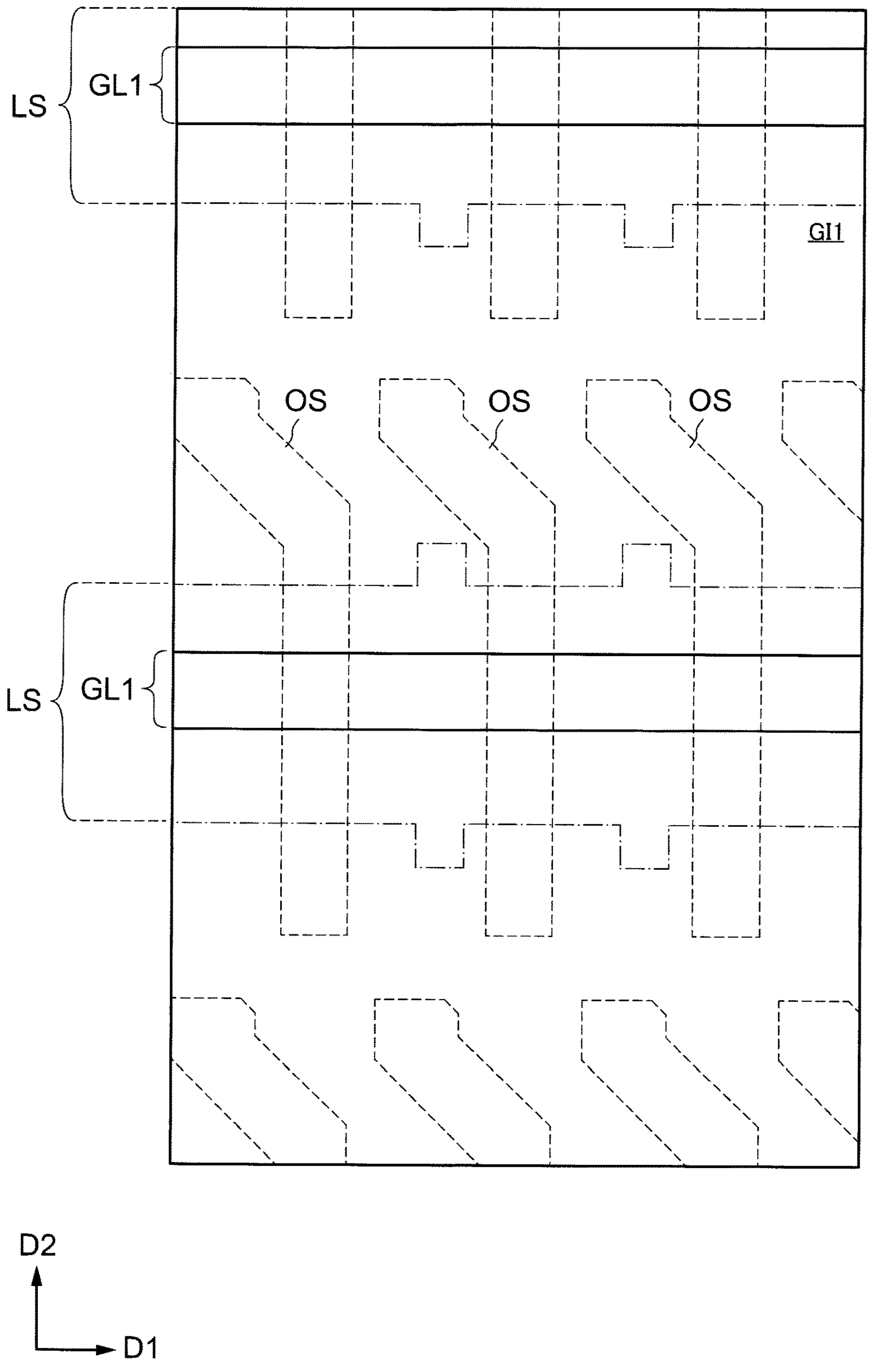
FIG. 12 is a plan view showing a layout of each layer in a display device according to an embodiment of the present invention.

As shown in FIG. 4, FIG. 10, and FIG. 12, the light shielding layer LS extends in the first direction D1 and is commonly provided in the pixels arranged in the first direction D1. A shape of the light shielding layer LS may be different depending on the pixel. In the present embodiment, a protruding part PJT is provided so as to protrude from a part of the light shielding layer LS extending in the first direction D1 to the second direction D2 intersecting the first direction D1. As shown in FIG. 8, the light shielding layer LS is provided in an area including the area where the gate electrode GL1 and the oxide semiconductor layer OS overlap in a plan view. The gate electrode GL1 can also be referred to as a “gate wire”.

Figure 11:
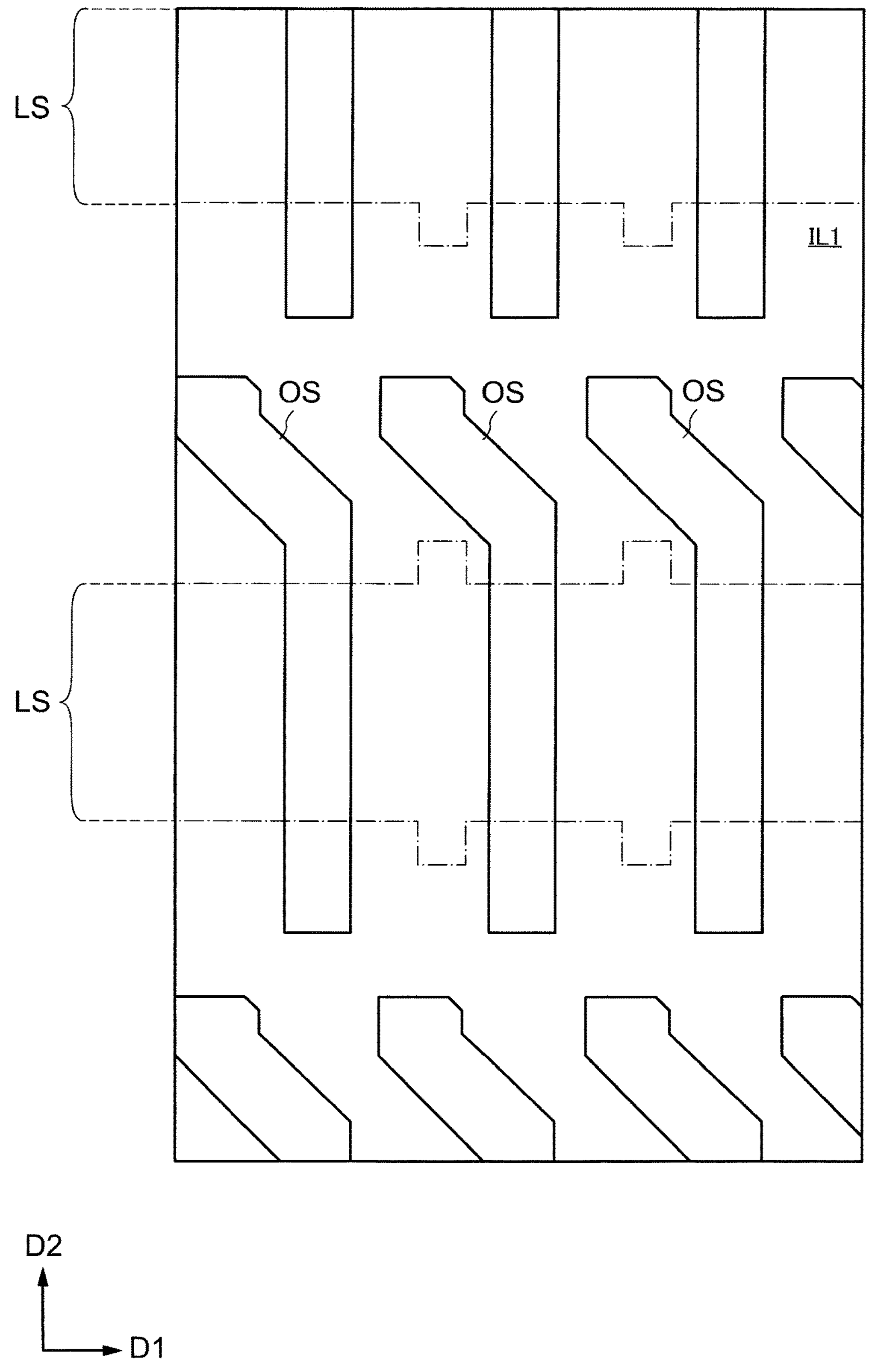
FIG. 11 is a plan view showing a layout of each layer in a display device according to an embodiment of the present invention.

As shown in FIG. 4, FIG. 11, and FIG. 12, the oxide semiconductor layer OS extends in the direction D2. The gate electrode GL1 extends in the direction D1 so as to intersect the oxide semiconductor layer OS. A pattern of the gate electrode GL1 is provided inside a pattern of the light shielding layer LS.

Figure 13:
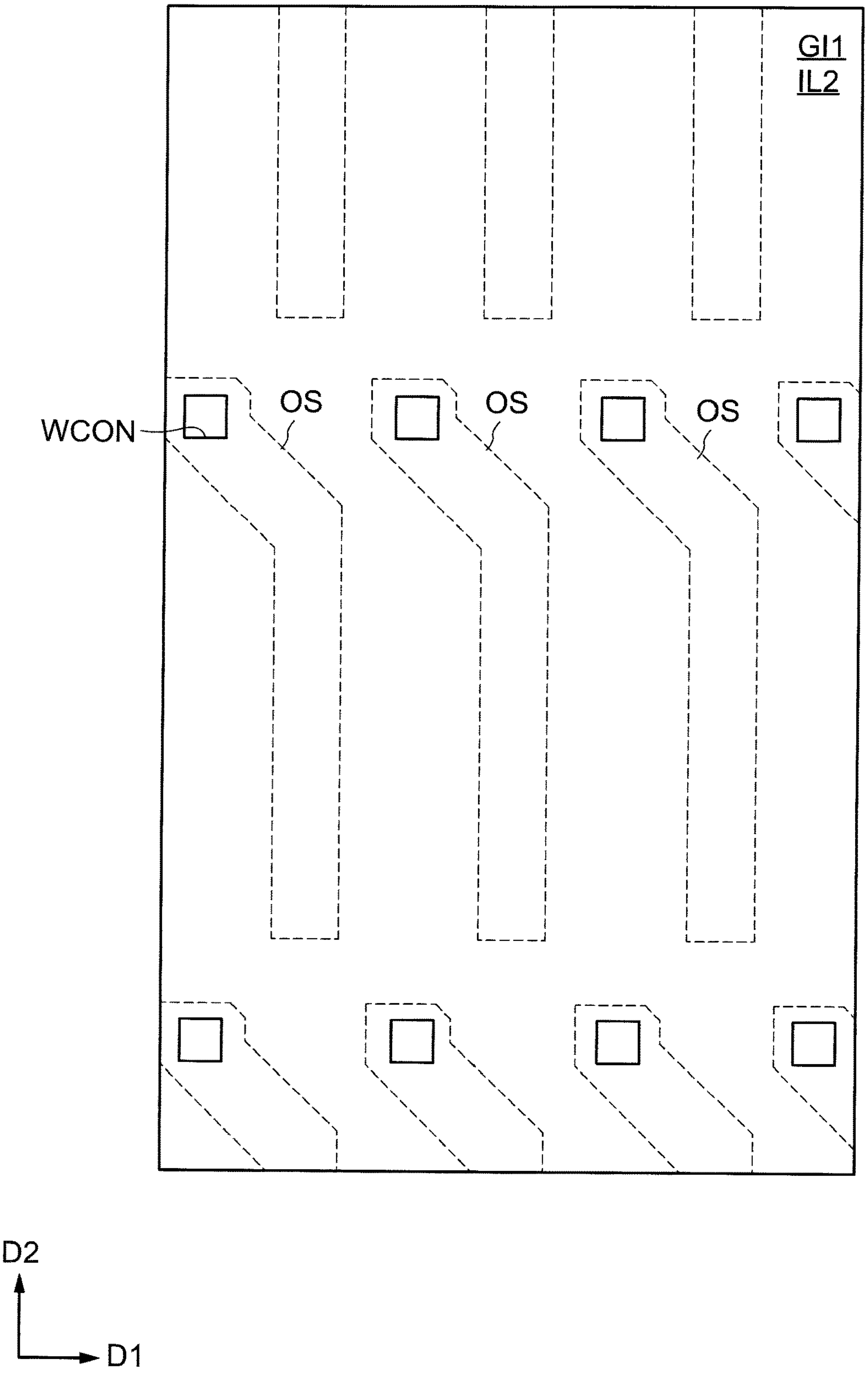
FIG. 13 is a plan view showing a layout of each layer in a display device according to an embodiment of the present invention.
Figure 14:
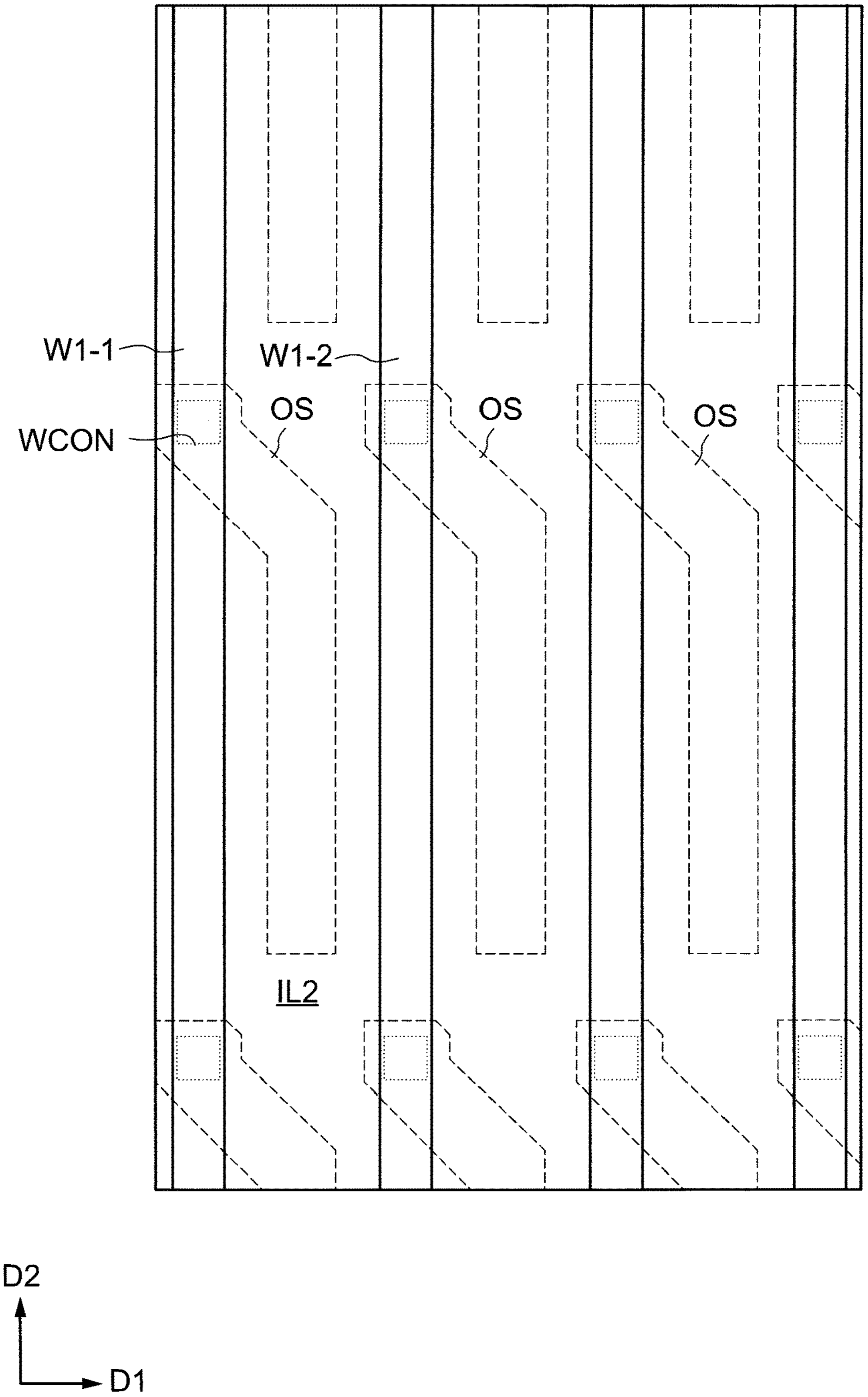
FIG. 14 is a plan view showing a layout of each layer in a display device according to an embodiment of the present invention.

As shown in FIG. 4, FIG. 13, and FIG. 14, the opening WCON is provided in an area overlapping the wiring W1 near an upper end of the pattern of the oxide semiconductor layer OS. A main part of the pattern of the oxide semiconductor layer OS extends in the direction D2 between a pair of the adjacent wirings W1. The remaining part of the pattern of the oxide semiconductor layer OS extends obliquely in the direction D1 and the direction D2 from the main part and overlaps the opening WCON.

As shown in FIG. 4 and FIG. 14, multiple wirings W1 extend in the direction D2. In the case where the adjacent wirings W1 need to be described separately, the adjacent wiring W1 is referred to as a first wiring W1-1 and a second wiring W1-2. In this case, it can be said that the main part of the oxide semiconductor layer OS extends in the direction D2 between the first wiring W1-1 and the second wiring W1-2, and intersects the gate electrode GL1.

Figure 15:
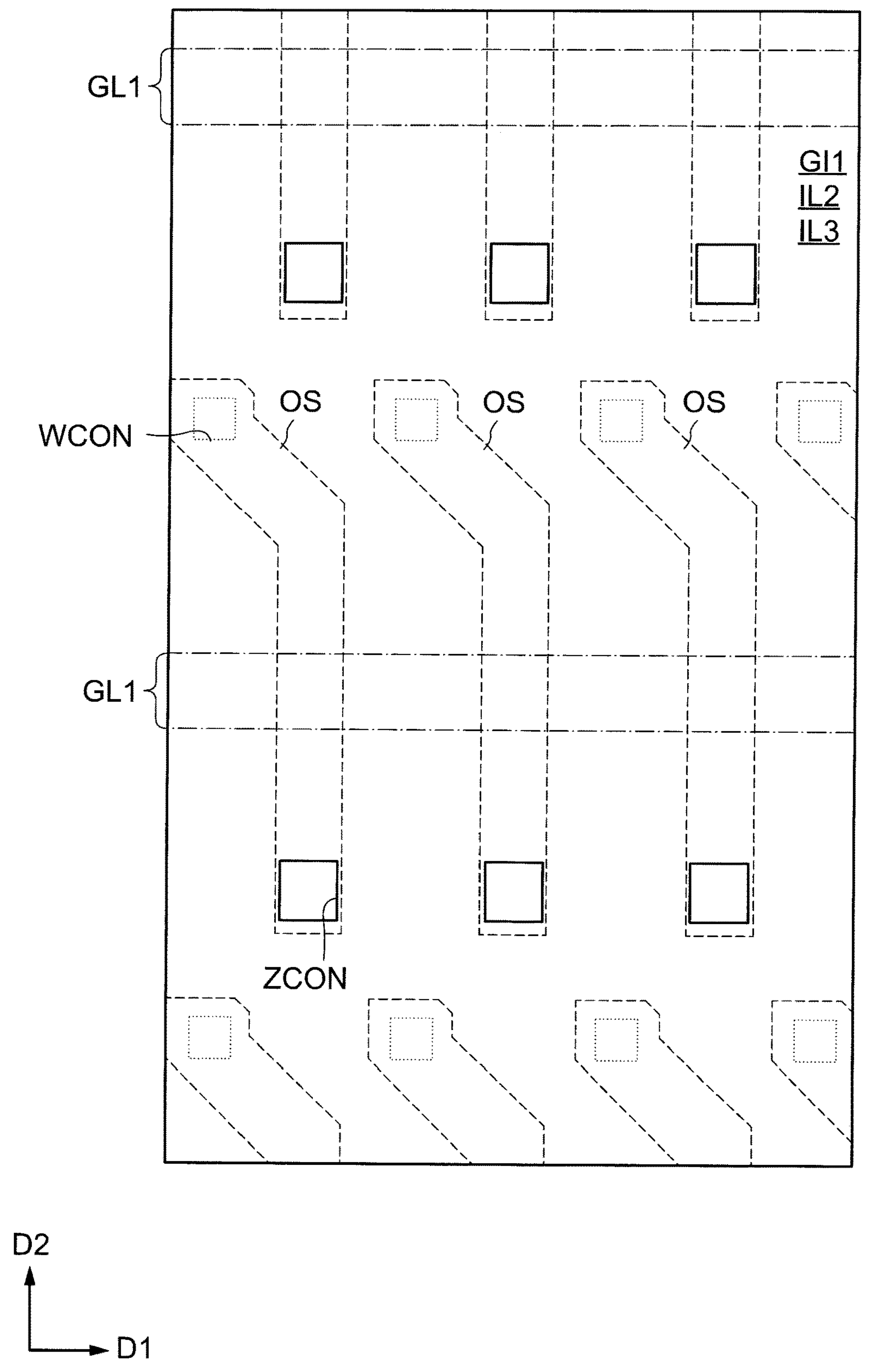
FIG. 15 is a plan view showing a layout of each layer in a display device according to an embodiment of the present invention.
Figure 16:
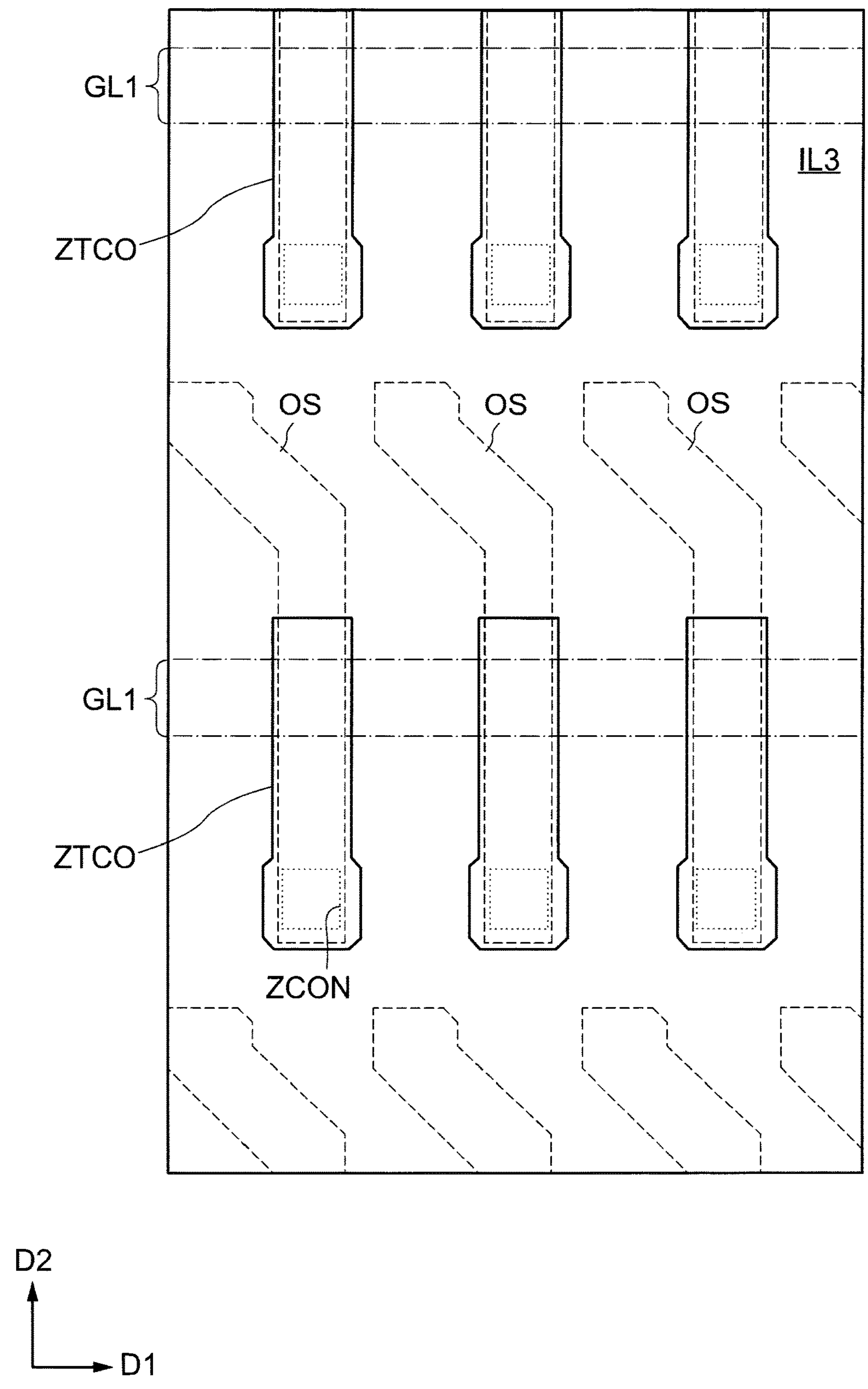
FIG. 16 is a plan view showing a layout of each layer in a display device according to an embodiment of the present invention.

As shown in FIG. 4, FIG. 15, and FIG. 16, the opening ZCON is provided near a lower end of the pattern of the oxide semiconductor layer OS. The opening ZCON is provided in an area overlapping the pattern of the oxide semiconductor layer OS and not overlapping the gate electrode GL1. The opening ZCON is provided in an area overlapping the connecting electrode ZTCO. The connecting electrode ZTCO overlaps the gate electrode GL1 and the oxide semiconductor layer OS between the first wiring W1-1 and the second wiring W1-2. Therefore, the connecting electrode ZTCO is in contact with the oxide semiconductor layer OS in the opening ZCON (the first contact area CON1) not overlapping the gate electrode GL1.

Figure 17:
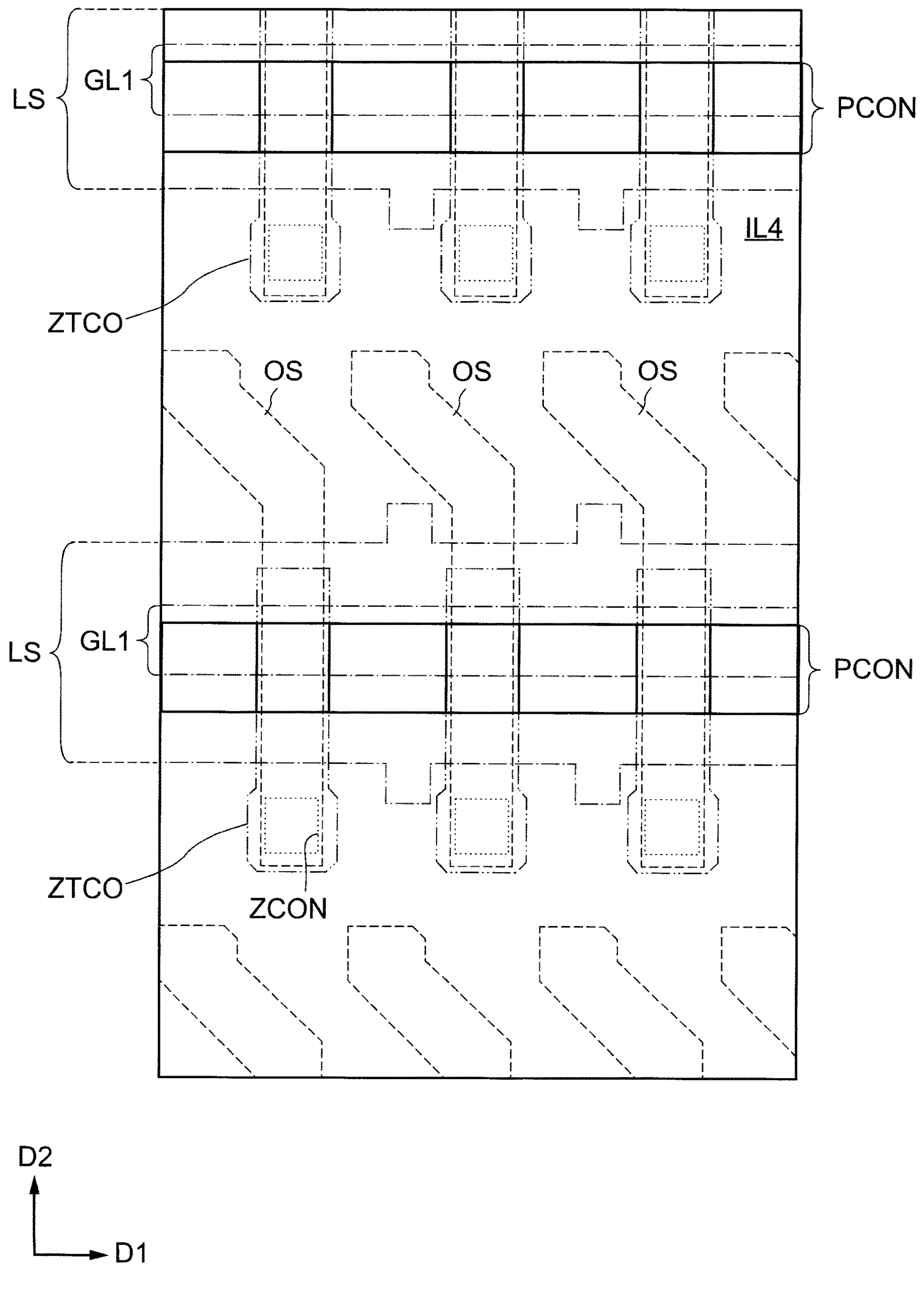
FIG. 17 is a plan view showing a layout of each layer in a display device according to an embodiment of the present invention.

As shown in FIG. 4, FIG. 16, and FIG. 17, the oxide semiconductor layer OS is in contact with the wiring W1 at the opposite side of the opening ZCON (the first contact area CON1) with respect to the gate electrode GL1. The opening ZCON (the first contact area CON1) does not overlap the light shielding layer LS.

As shown in FIG. 4, FIG. 16, and FIG. 17, the opening PCON is located near the top edge of the pattern of the connecting electrode ZTCO. The opening PCON is formed in the insulating layer IL4. The opening PCON is provided in the area overlapping on the pattern of the gate electrode GL1 and the pattern of the connecting electrode ZTCO. Inside the opening PCON, the connecting electrode ZTCO is exposed. As described above, the opening PCON is provided to extend along the first direction D1. The gate wiring GL extends along the first direction so as to overlap on the opening PCON. The light-shielding layer LS extends along the first direction so as to overlap on the opening PCON. The width (length in the second direction D2) of the opening PCON should be smaller than the width of the light-shielding layer LS, and should be wide enough to ensure contact between the connecting electrode ZTCO and the pixel electrode PTCO to be formed later.

Figure 18:
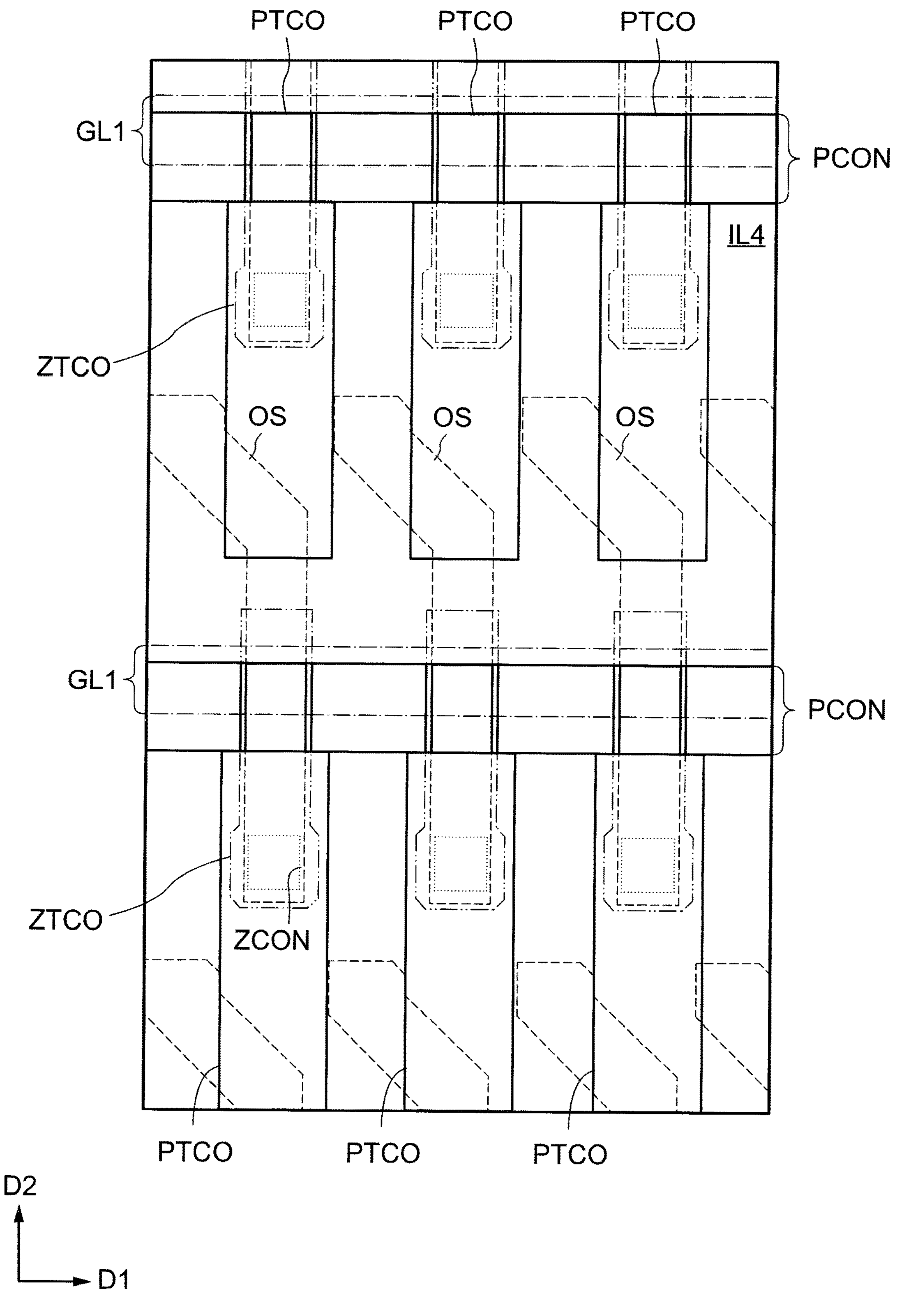
FIG. 18 is a plan view showing a layout of each layer in a display device according to an embodiment of the present invention.

As shown in FIG. 4 and FIG. 18, the pixel electrode PTCO is provided in the area overlapping on the opening PCON. The pixel electrode PTCO is formed on the insulating layer IL4 and inside the opening PCON. The connecting electrode ZTCO and the pixel electrode PTCO are connected inside the opening PCON. The pixel electrode PTCO overlaps on the gate electrode GL1, the oxide semiconductor layer OS, and the connecting electrode ZTCO between the first wiring W1-1 and the second wiring W1-2. Therefore, the pixel electrode PTCO contacts the connecting electrode ZTCO at the opening PCON (the second contact area CON2) overlapping on the gate electrode GL1. Of the rectangular-shaped pixel electrode PTCO, the area provided on the top surface of the insulating layer IL4 is less affected by the potential of the wiring W1 because the distance from the wiring W1 is large because the insulating layer IL4 is interposed between it and the wiring W1. On the other hand, the area of the pixel electrode PTCO in contact with the connecting electrode ZTCO is located at the bottom of the opening groove, without the intervention of the insulating layer IL4 and the distance from the wiring W1 is relatively close. Therefore, to increase the distance between the wiring W1 and the pixel electrode PTCO, the width (length in the first direction D1) of the pixel electrode PTCO in the area in contact with the connecting electrode ZTCO may be smaller than the width (length in the first direction D1) of the pixel electrode PTCO in the area on the top surface of the insulating layer IL4.

Figure 19:
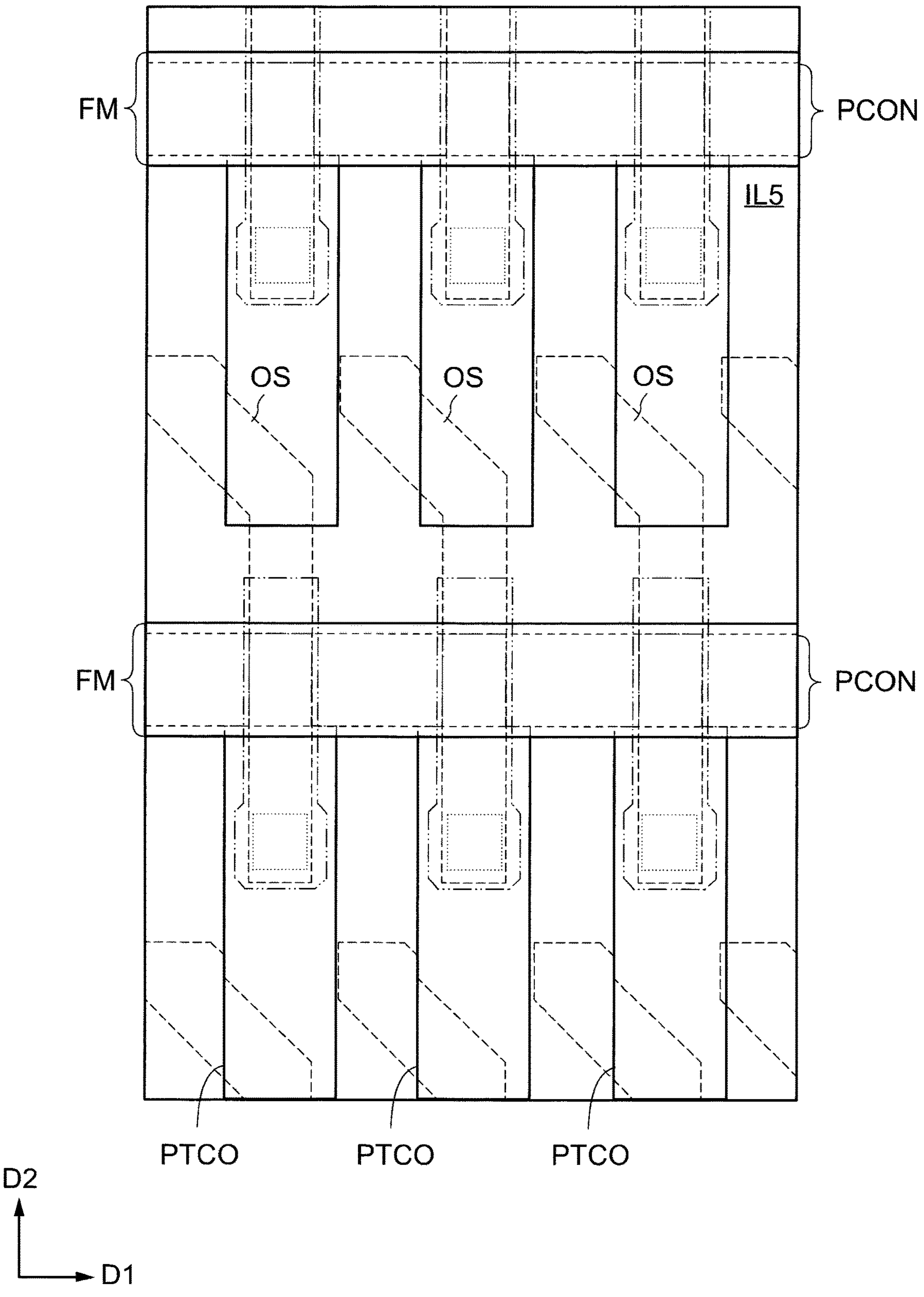
FIG. 19 is a plan view showing a layout of each layer in a display device according to an embodiment of the present invention.

As shown in FIG. 4 and FIG. 19, the filling member FM is provided to fill the opening PCON. The filling member FM is provided on the insulating layer IL5. The filling member FM is provided to extend in the first direction D1 as well as the opening PCON. The width (length in the second direction D2) of the filling member FM may be the same as the width (length in the second direction D2) of the opening PCON, or may be larger. In FIG. 19, the filling member FM is shown when it is provided above the upper ends UE-1 and UE-2 of the opening PCON.

Figure 20:
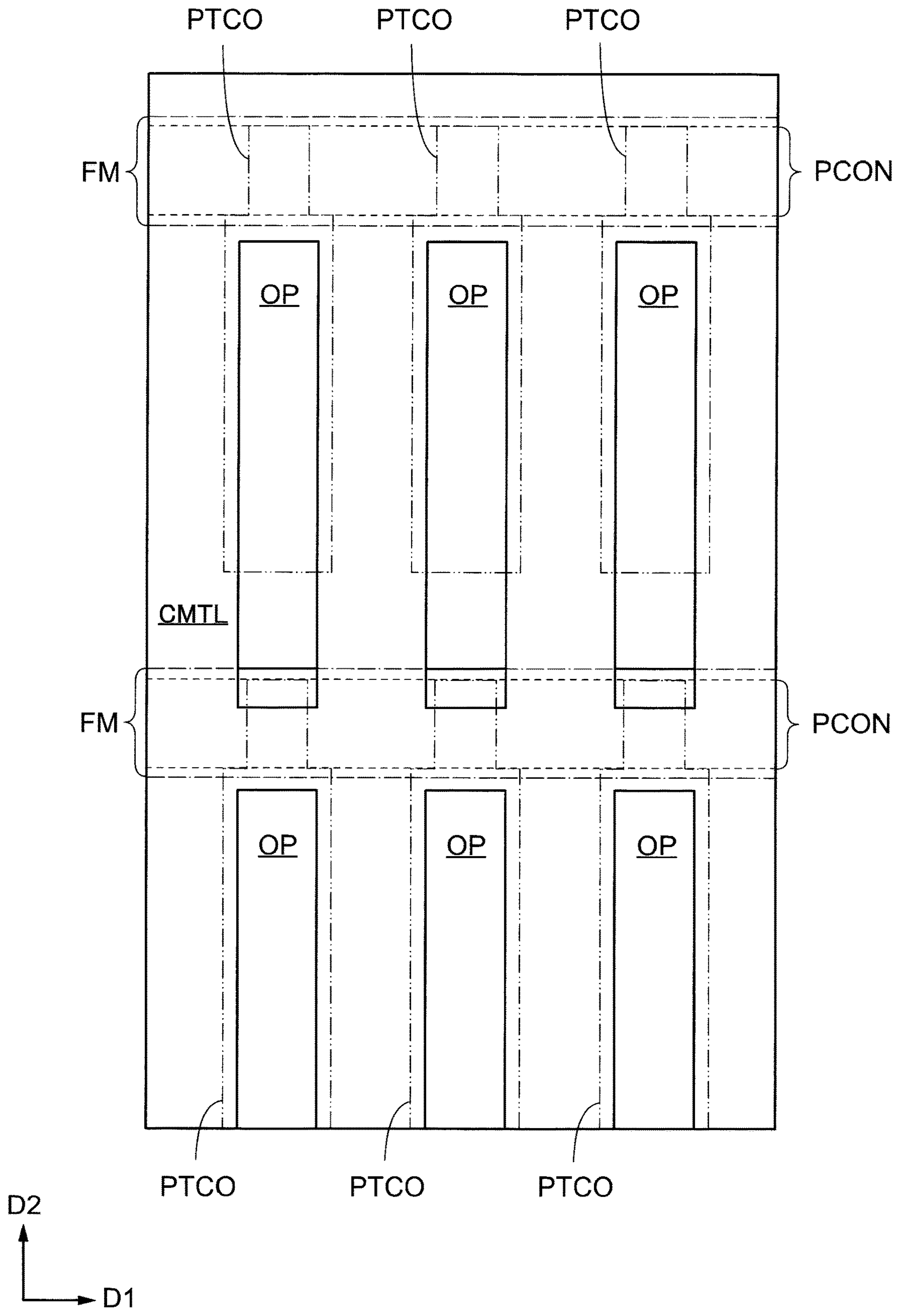
FIG. 20 is a plan view showing a layout of each layer in a display device according to an embodiment of the present invention.

As shown in FIG. 4 and FIG. 20, the common auxiliary electrode CMTL overlaps on a portion of the pixel electrode PTCO of each of the plurality of pixels, is provided in a grid pattern, and an opening OP is formed at a position opposite to each pixel electrode PTCO. Specifically, the common auxiliary electrode CMTL is commonly provided for multiple or all pixels without being divided within the image display area, and overlaps on the opening PCON of each pixel and also on a part of the edge of each pixel electrode PTCO. Therefore, in the opening PCON, the common auxiliary electrode CMTL overlaps on the pixel electrode PTCO. The common auxiliary electrode CMTL also overlaps on the gate electrode GL1 in a plan view. On the other hand, the common auxiliary electrode CMTL is opened so that the pixel electrode PTCO including the opening ZCON is exposed. In other words, the opening ZCON (first contact area CON1) is included in the display area. The display area here means the area where light from the pixel can be seen by the user when viewed in pixel units. For example, an area where light is blocked by a metal layer and where the user cannot see the light is not included in the display area. In other words, the above display area may be called the "translucent area (or opening area). The common auxiliary electrode CMTL is arranged along the first direction D1 and the second direction D2. The common auxiliary electrode CMTL overlaps on the gate wiring GL and the wiring W1. The common auxiliary electrode CMTL covers the filling member FM. The common auxiliary electrode CMTL has a light-shielding function and can suppress light irradiation to the channel of the oxide semiconductor layer OS. Therefore, in the display device 10A including such a common auxiliary electrode CMTL, the characteristics of the transistor Tr1 are stabilized and the reliability is improved.

Figure 21:
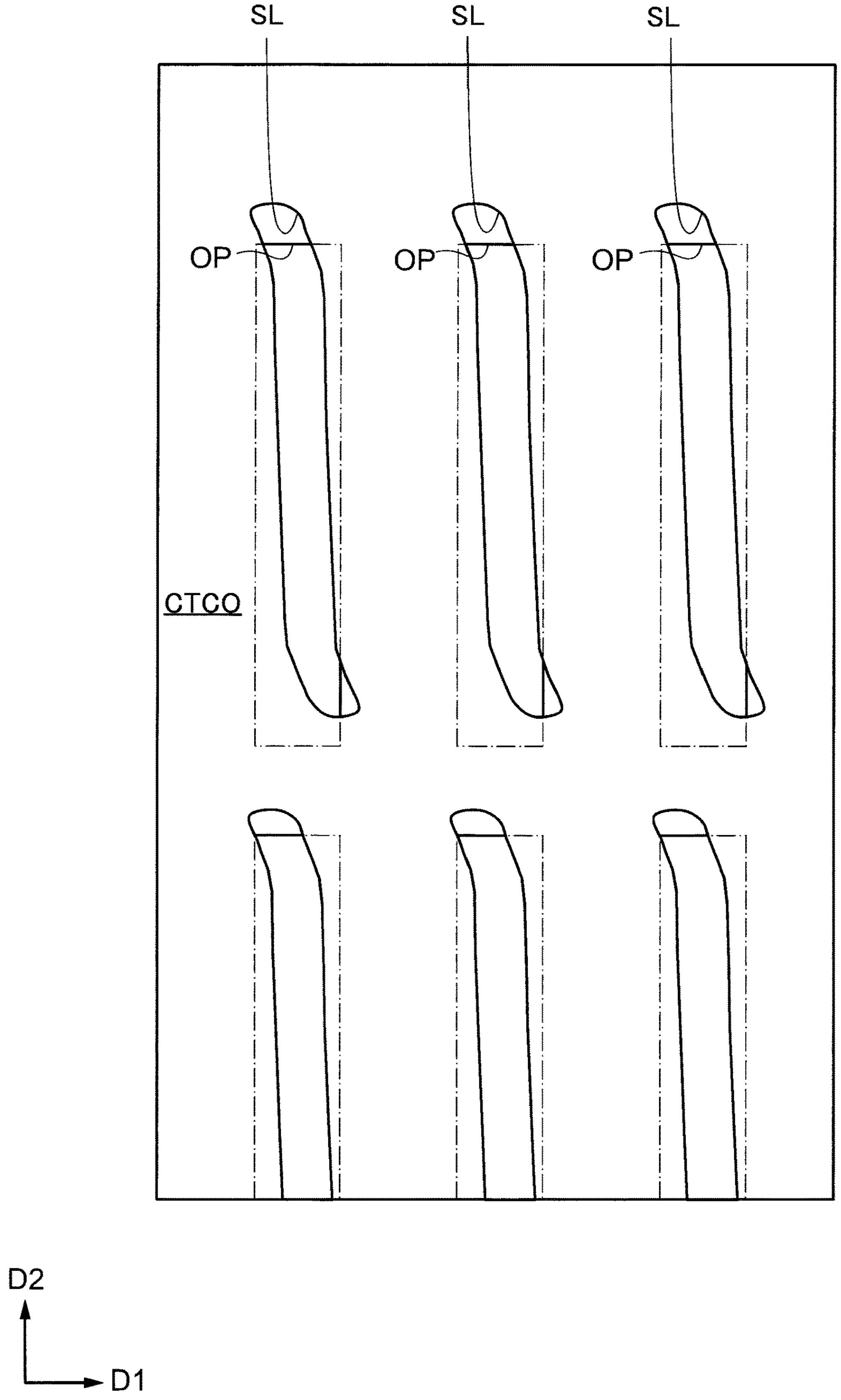
FIG. 21 is a plan view showing a layout of each layer in a display device according to an embodiment of the present invention.

As shown in FIG. 21, the common electrode CTCO is common to multiple or all pixels without being divided within the image display area 23. The common electrode CTCO overlaps on the pixel electrode PTCO. The common electrode CTCO has a slit SL in the area corresponding to each of the above-mentioned openings OP. The slit SL has a curved shape (vertically long S-shape). The tip of the slit SL has a shape in which the width perpendicular to the direction of extension of the tip is smaller. One tip of the slit SL overlaps on the common auxiliary electrode CMTL and on the pixel electrode PTCO in the opening PCON. The other tip of the slit SL is located within the opening OP, but does not overlap on the pixel electrode PTCO.

[10. Configuration of Spacer SP]

Referring to FIG. 22 to FIG. 26, the configuration of the spacer SP provided on the array substrate in the configuration of the above first embodiment will be described. In the array substrate and the opposing substrate of the display device 10, the spacers SP are provided in the image display area 23 at a ratio of one spacer per one or more pixels. The spacer SP provided on the array substrate and the spacer SP provided on the opposite substrate face each other to form a cell gap. The spacers SP are provided at intervals for each of a plurality of pixels. It is also possible to adopt a configuration in which the spacer SP is provided only on the array substrate and the spacer SP formed on the array substrate is in contact with the opposing substrate.

Figure 22:
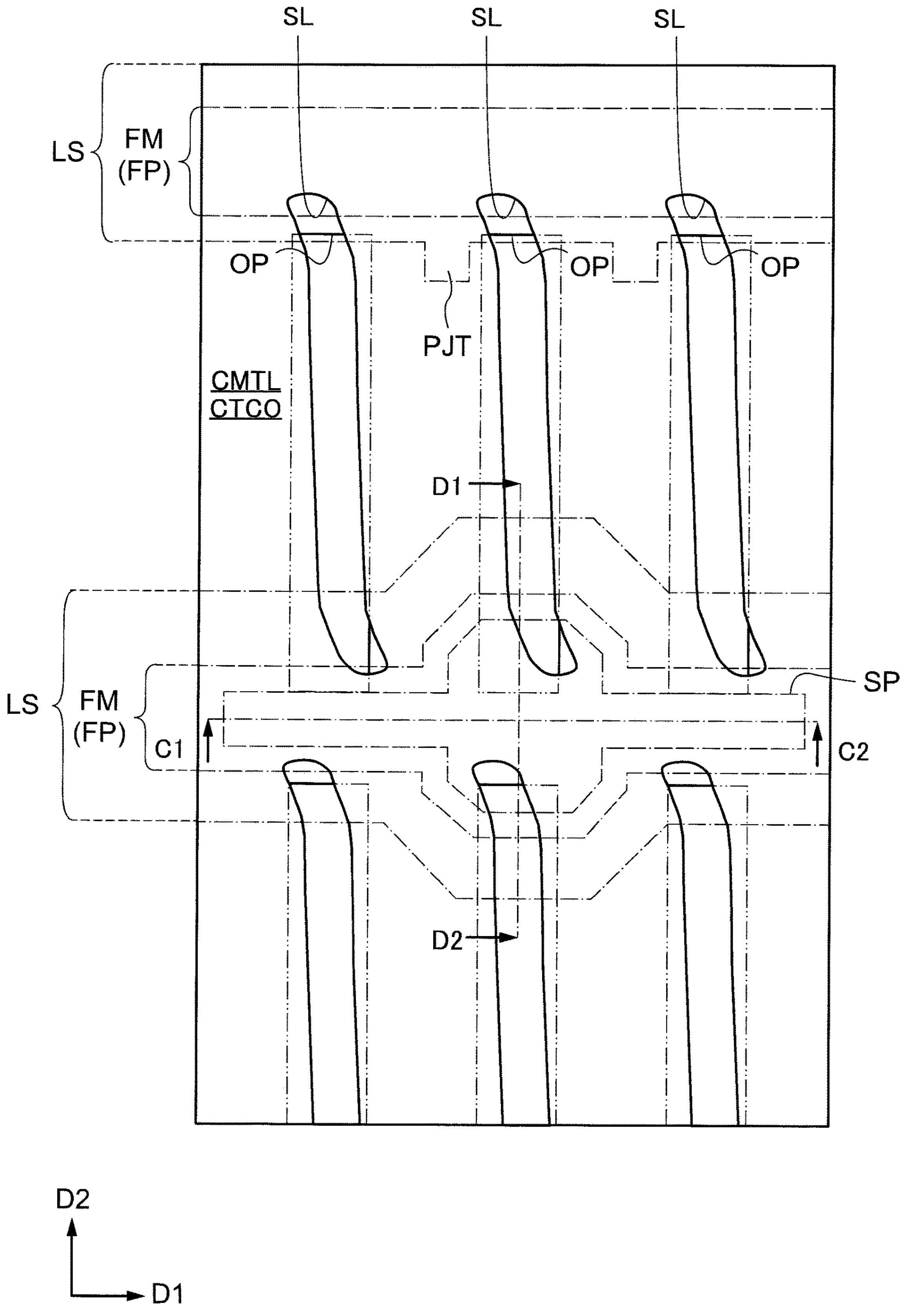
FIG. 22 is a cross-sectional view showing a configuration of a display device according to an embodiment of the present invention.
Figure 23:
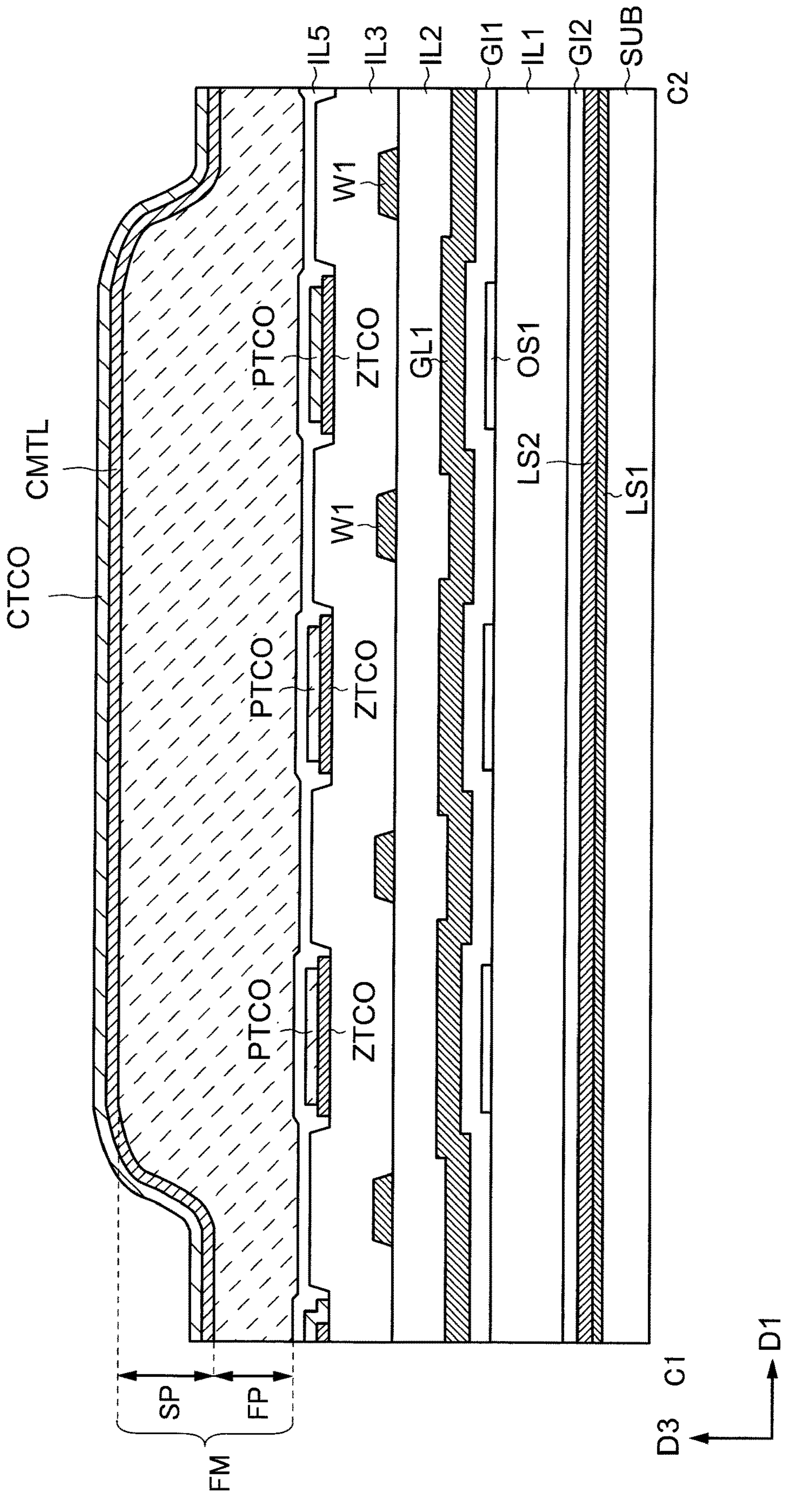
FIG. 23 is a cross-sectional view of the display device shown in FIG. 22 at the line C1-C2.
Figure 24:
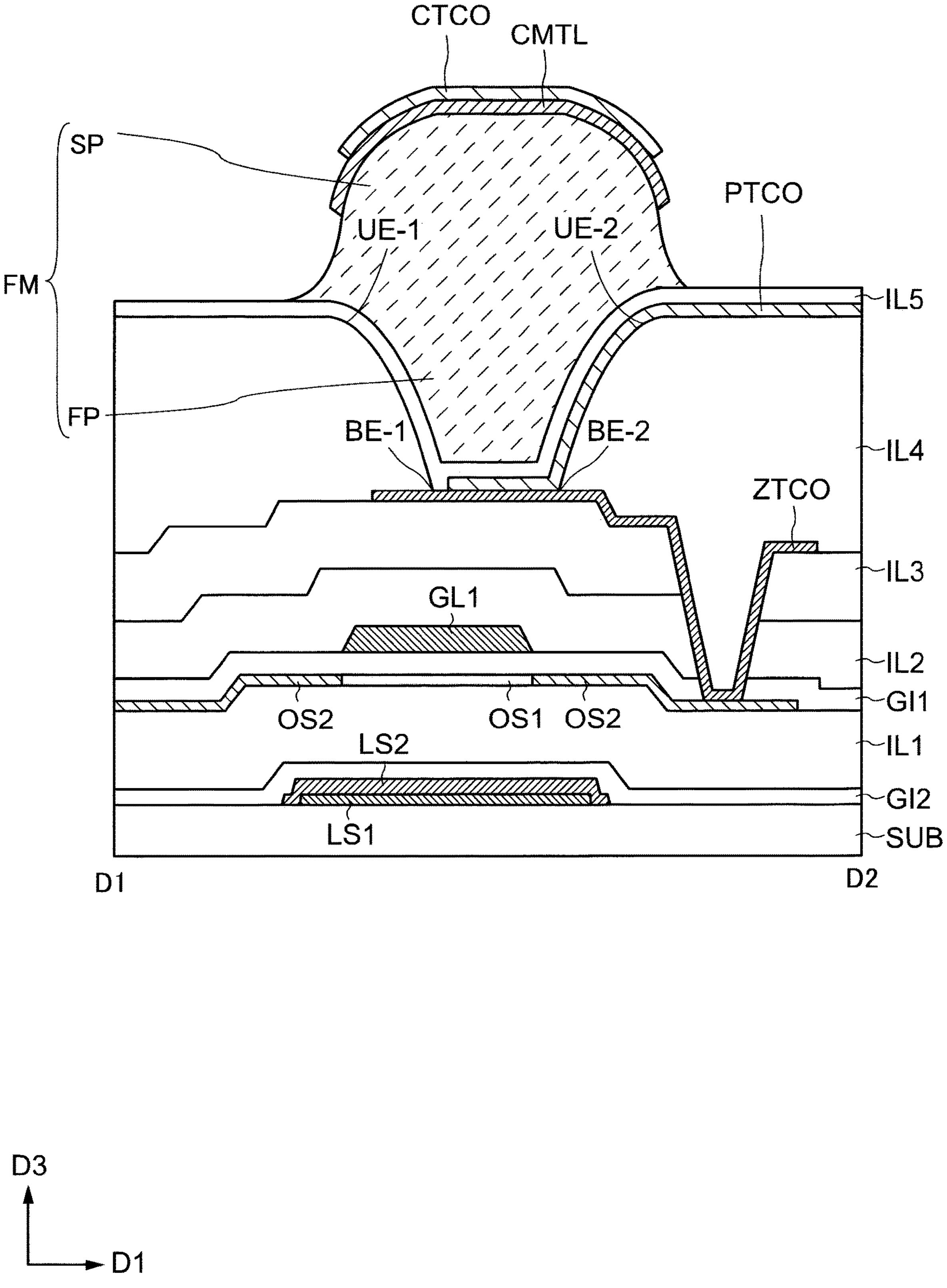
FIG. 24 is a cross-sectional view of the display device shown in FIG. 22 at the line D1-D2.

FIG. 22 shows a plan view of the light-shielding layer LS, the filling member FM, the common auxiliary electrode CMTL, and the common electrode CTCO. FIG. 23 shows a cross-sectional view cut along the C1-C2 line shown in FIG. 22. FIG. 24 shows a cross-sectional view cut along the D1-D2 line shown in FIG. 22. In FIG. 22 to FIG. 26, the configurations other than the light-shielding layer LS, the filling member FM, the common auxiliary electrode CMTL, and the common electrode CTCO are the same as those described in FIG. 11 to FIG. 18, and detailed illustrations are omitted.

As shown in FIG. 22, the filling member FM extends along the first direction D1 so as to overlap the opening PCON. The filling member FM includes a filling portion FP. In the area where the filling member FM is provided, a protrusion (also called a spacer SP) protrudes from the top surface of the pixel electrode PTCO provided on the insulating layer IL4. As shown in FIG. 23 and FIG. 24, the common auxiliary electrode CMTL is provided above the spacer SP of the filling member FM. A common electrode CTCO is provided above the common auxiliary electrode CMTL.

As shown in FIG. 22 and FIG. 23, the area where the spacer SP is provided overlaps on the light-shielding layer LS. As shown in FIG. 22, the common auxiliary electrode CMTL and the common electrode CTCO may have the same pattern as the pixels where the spacer SP is not provided.

Figure 25:
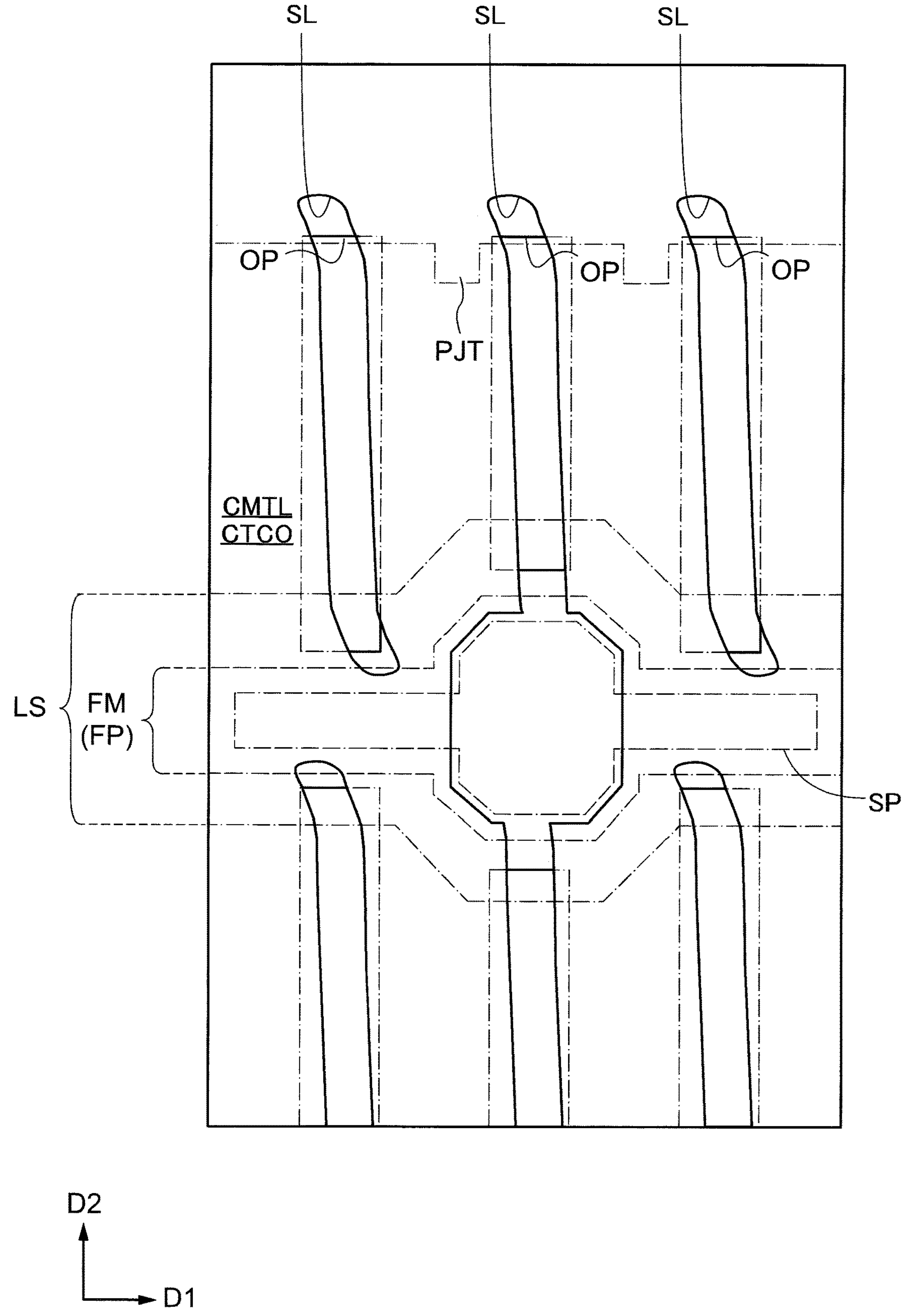
FIG. 25 is a plan view showing a configuration of a display device according to an embodiment of the present invention.

FIG. 25 shows the common auxiliary electrode CMTL and the common electrode CTCO having a pattern that is partially different from the pattern of the common auxiliary electrode CMTL and the common electrode CTCO shown in FIG. 23. As shown in FIG. 25, the patterns of the common auxiliary electrode CMTL and the common electrode CTCO in the area where the spacer SP is provided may be different from the patterns of the common auxiliary electrode CMTL and the common electrode CTCO in the area where the spacer SP is not provided. For example, the opening OP of the common auxiliary electrode CMTL may be provided so that it does not overlap the filling member FM or the spacer SP. The slit SL of the common electrode CTCO may be provided continuously with the adjacent slit SL in the second direction D2.

The thickness of the common auxiliary electrode CMTL and the common electrode CTCO may differ for each spacer in the manufacturing process of the array substrate. In such a case, it may become a factor of variation of the cell gap. Therefore, in the configuration shown in FIG. 25, openings are provided in the common auxiliary electrode CMTL and the common electrode CTCO in the area where the spacer SP is provided. In other words, since the common auxiliary electrode CMTL and the common electrode CTCO are not provided on the spacer SP, the variation of the cell gap can be suppressed.

In addition, polyimide, for example, is coated on the surface of the array substrate as an alignment film. Polyimide has better adhesion to the filling material FM polyimide than to the transparent electrode (e.g., ITO) or metal film. Therefore, when friction occurs with the spacer on the opposite substrate side, the polyimide in the alignment film can be prevented from being scraped off.

Figure 26:
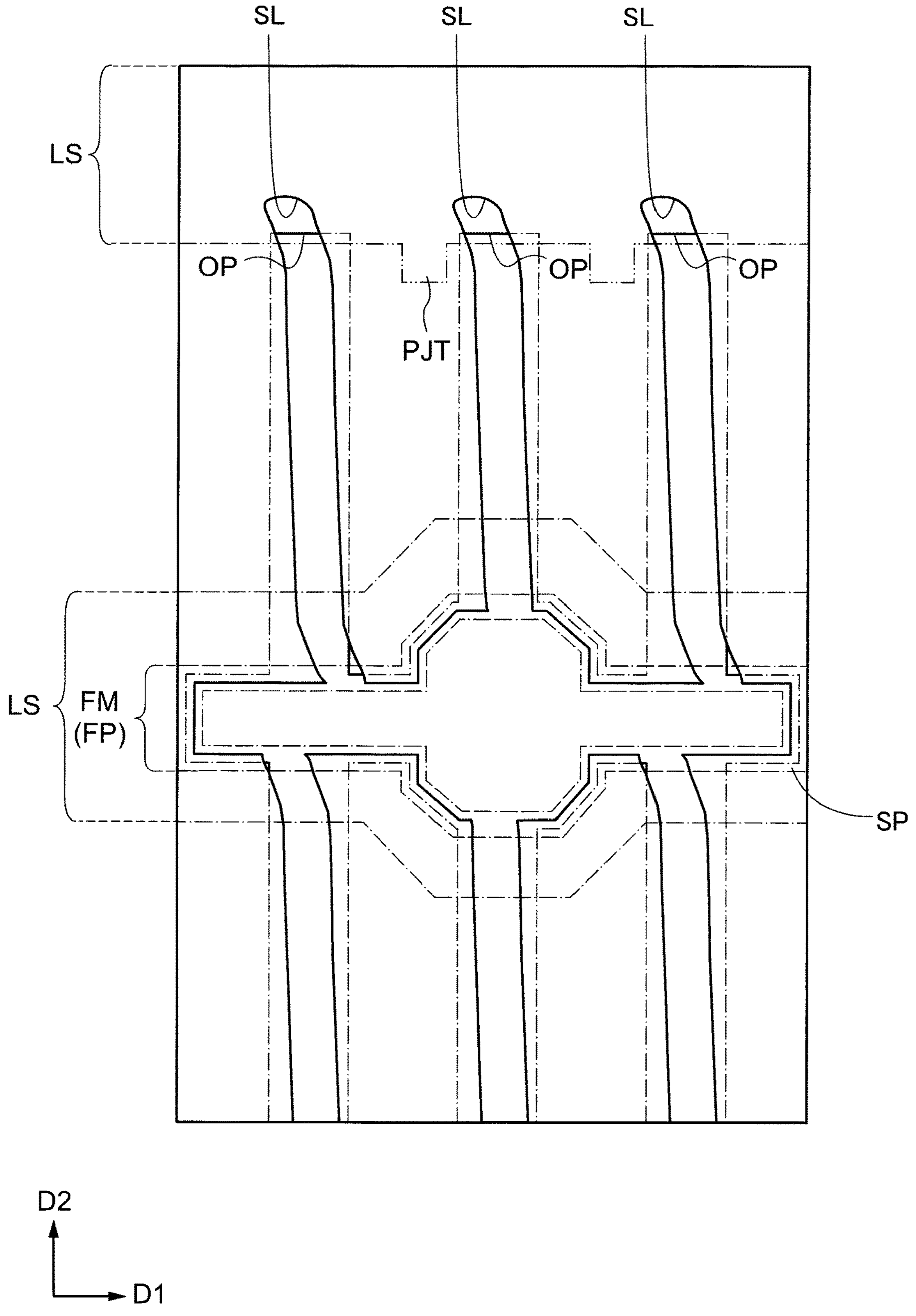
FIG. 26 is a plan view showing a configuration of a display device according to an embodiment of the present invention.

FIG. 26 shows the common auxiliary electrode CMTL and the common electrode CTCO having a pattern that is partially different from the patterns of the common auxiliary electrode CMTL and the common electrode CTCO shown in FIG. 23 and FIG. 25. As shown in FIG. 26, the pattern of the opening OP of the common auxiliary electrode CMTL and the pattern of the slit SL of the common electrode CTCO in the area where the spacer SP is provided may be different from the patterns of the opening OP of the common auxiliary electrode CMTL and the slit SL of the common electrode CTCO in the area where the spacer SP is not provided. For example, the pattern of the opening OP of the common auxiliary electrode CMTL may not overlap the filling member FM or the spacer SP. The common auxiliary electrode CMTL may be provided with an opening so as to surround the spacer SP. Thereby, the openings OP adjacent to the second direction D2 and the openings surrounding the spacer SP may be provided continuously. The pattern of the slit SL of the common electrode CTCO may be provided so that it does not overlap the filling member FM and the spacer SP. The common electrode CTCO may be provided with an opening to surround the spacer SP. Thereby, the slit SL adjacent in the second direction D2 and the opening surrounding the spacer SP may be provided continuously.

When local pressure is applied to the display device from the opposite substrate side, the spacer on the opposite substrate side and the spacer on the substrate SUB side become misaligned. At this time, if an area extending in the direction D1 exists in the spacer SP as shown in FIG. 26, the spacer on the opposite substrate side can be supported even if the position of the spacer SP on the opposite substrate side shifts. In the case of the shape of the spacer SP shown in FIG. 26, it is also possible to suppress the polyimide from being scraped off when friction occurs with the spacer on the opposite substrate side.

[11. Materials of Each Member of Display Device 10]

A rigid substrate having light transmittance and no flexibility, such as a glass substrate, a silica substrate, and a sapphire substrate can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrodes GL1, GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

For example, a stacked structure of Ti, Al, and Ti is used as the gate electrode GL1. In the present embodiment, the cross-sectional shape of a pattern end of the gate electrode GL1 having the above stacked structure is a forward taper shape.

General insulating materials can be used as the gate insulating layers GI1, GI2, and the insulating layers IL1 to IL5. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like can be used as the insulating layers IL1 to IL3, and IL5. Low-defect insulating layers can be used as these insulating layers. Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5. The above materials may be used in a single layer or a stacked layer as a member of the insulating layer and the like.

The above $SiO_xN_y$ and $AlO_xN_y$ are silicone compounds and aluminum compounds containing nitrogen (N) in a smaller ratio (x>y) than oxygen (O). The above $SiN_xO_y$ and $AlN_xO_y$ are silicon compounds and aluminum compounds containing oxygen in a smaller ratio (x>y) than nitrogen.

$SiO_x$ with a thickness of 100 nm is used as the gate insulating layer GI1 as an example of the above insulating layer. $SiO_x$, $SiN_x$, and $SiO_x$ with a total thickness of 600 nm to 700 nm is used as the insulating layer ID $SiO_x$ and $SiN_x$ with a total thickness of 60 nm to 100 nm is used as the gate insulating layer GI2. $SiO_x$, $SiN_x$, and $SiO_x$ with a total thickness of 300 nm to 500 nm is used as the insulating layer IL2. $SiO_x$ (single layer) with a total thickness of 200 nm to 500 nm, $SiN_x$ (single layer), or a stacked layer thereof is used as the insulating layer IL3. The organic layer with a thickness of 2 μm to 4 μm is used as the insulating layer IL4. $SiN_x$ (single layer) with a thickness of 50 nm to 150 nm is used as the insulating layer IL5.

Organic insulating materials such as polyimide resin, acrylic resin, epoxy resin, silicone resin, fluorine resin, or siloxane resin are used as the filling member FM.

An oxide semiconductor having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation. The oxide semiconductor layer OS may be amorphous or polycrystalline. The oxide semiconductor layer OS may be a mixture of amorphous and crystalline phases.

As the oxide semiconductor layer OS, the ratio of indium to the total oxide semiconductor layer OS may be 50% or more. In addition to indium, gallium (Ga), zinc (Zn), aluminum (Al), hafnium (Hf), yttrium (Y), zirconium (Zr), and lanthanides are used as oxide semiconductor layer OS. Elements other than those listed above may be used as the oxide semiconductor layer OS. When the ratio of indium to the entire oxide semiconductor layer OS is 50% or more, the oxide semiconductor layer OS has a polycrystalline structure.

A transparent conductive layer is used as the connecting electrode ZTCO, the pixel electrode PTCO, and the common electrode CTCO. A mixture of indium oxide and tin oxide (ITO) and a mixture of indium oxide and zinc oxide (IZO) can be used as the transparent conductive layer. Materials other than the above may be used as the transparent conductive layer.

Second Embodiment

Figure 27:
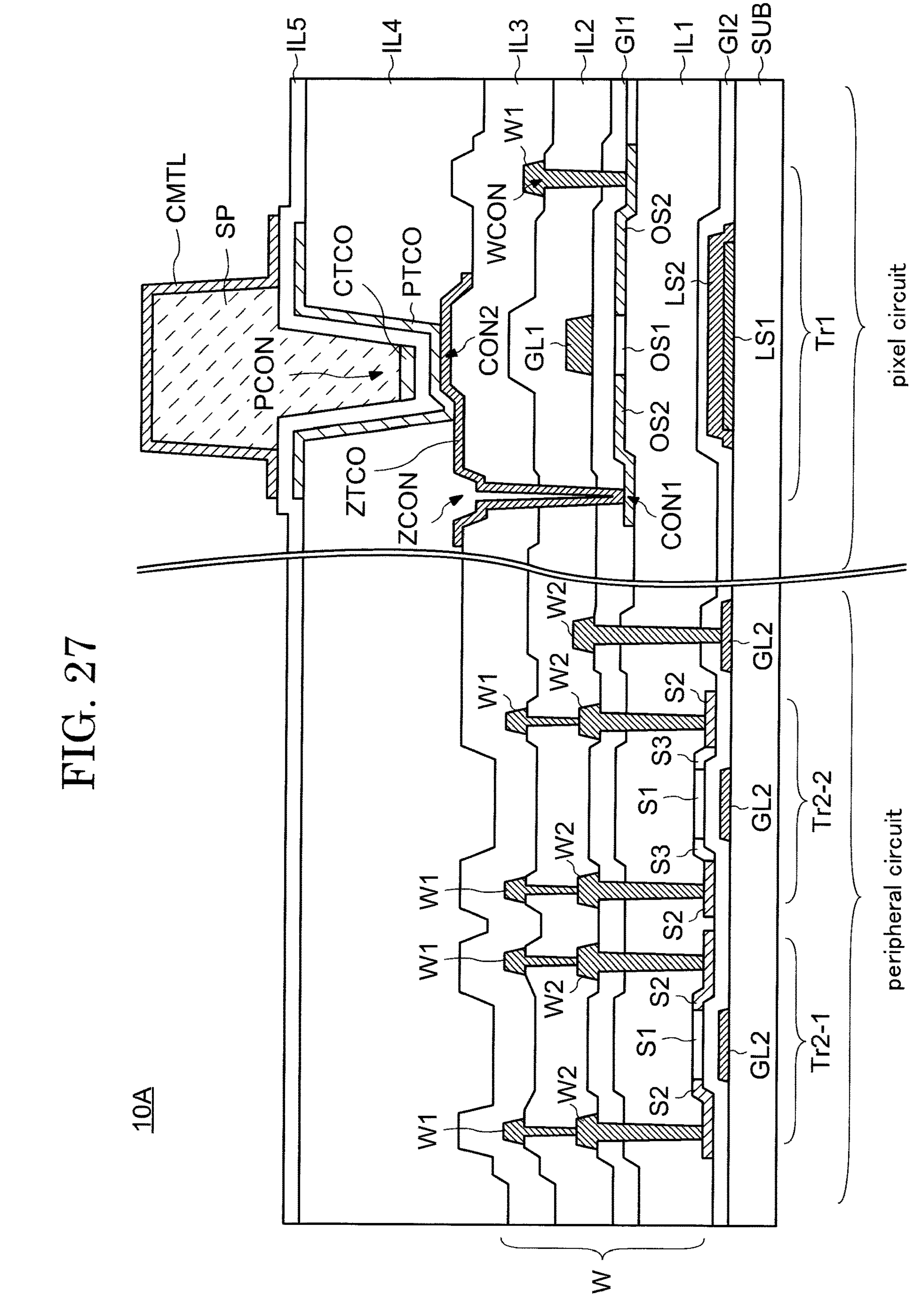
FIG. 27 is a cross-sectional view showing a configuration of a display device according to an embodiment of the present invention.
Figure 28:
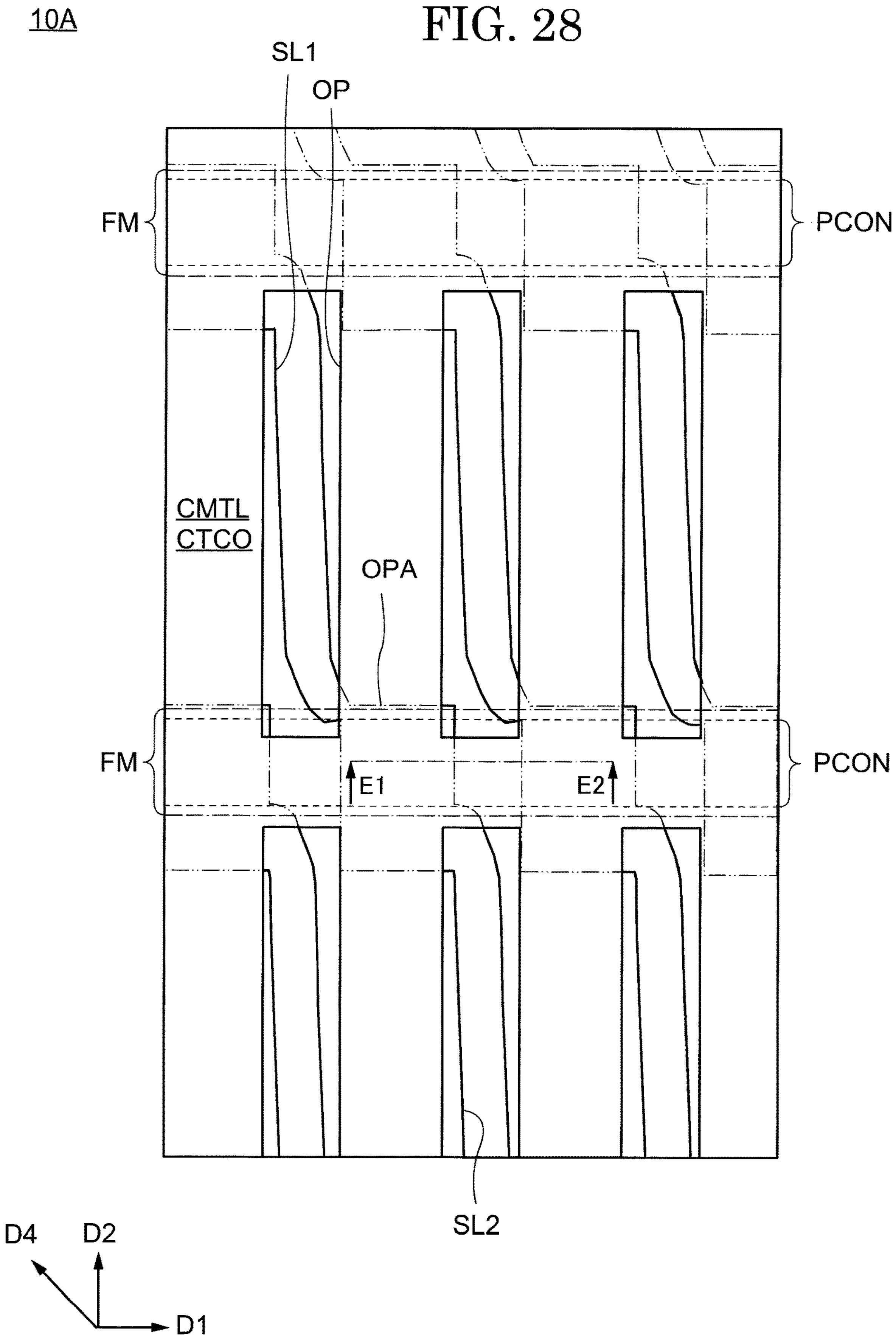
FIG. 28 is a plan view showing a configuration of a display device according to an embodiment of the present invention.
Figure 29:
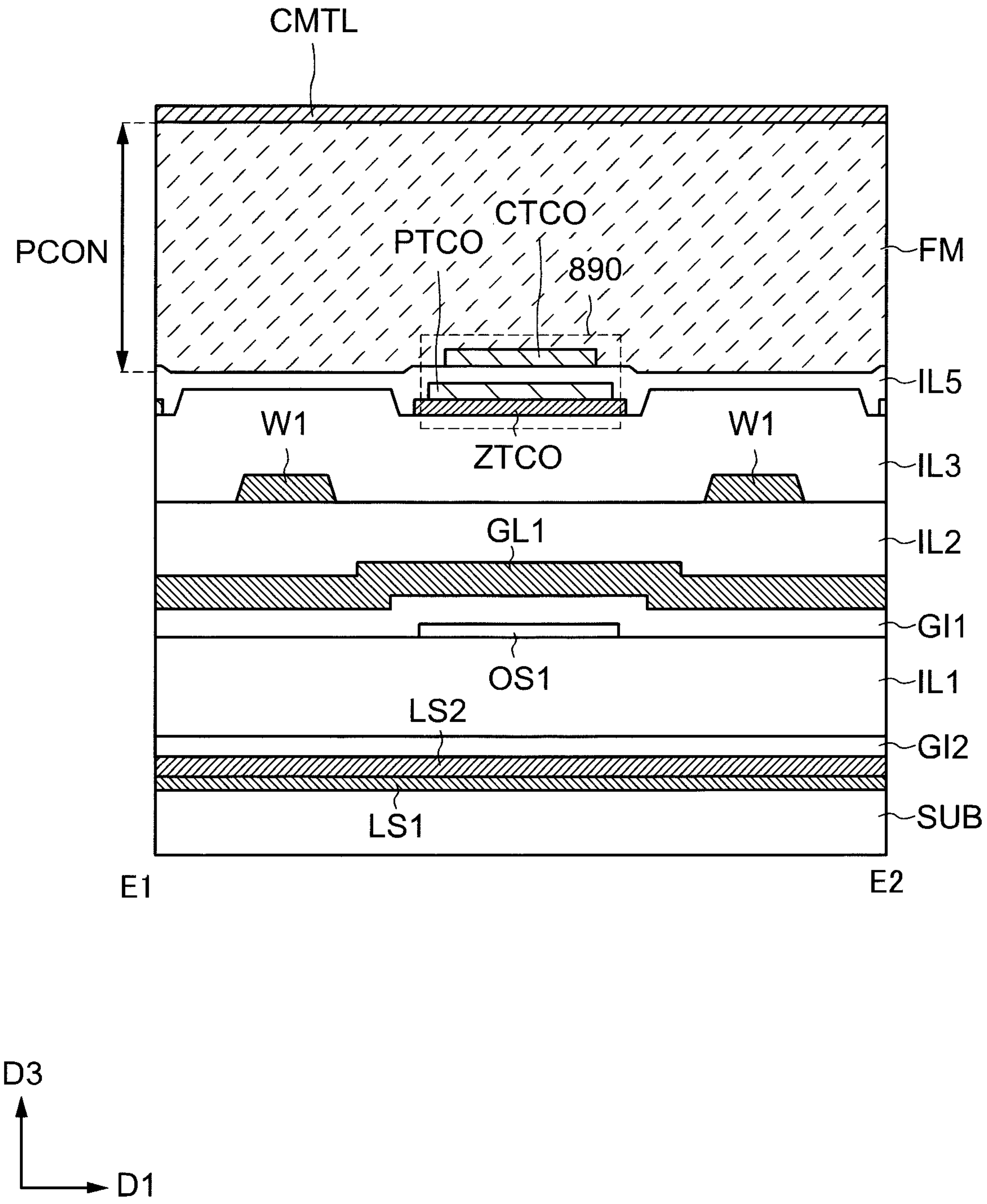
FIG. 29 is a cross-sectional view of the display device shown in FIG. 28 at the line E1-E2.

With reference to FIG. 27 to FIG. 29, the configuration of a display device 10A according to an embodiment of the present invention will be described. FIG. 27 is a cross-sectional view showing the configuration of the display device 10A according to an embodiment of the present invention. FIG. 28 is a plan view showing the configuration of the display device 10A according to an embodiment of the invention. FIG. 29 is a cross-sectional view of the display device 10A shown in FIG. 28 at the line E1-E2. The cross-sectional view in FIG. 27 is a cross-sectional view to illustrate the layer structure of the display device 10A. In the pixel circuit in FIG. 27, the area around the contact hole in the pixel is mainly shown, and only a part of the translucent area (opening area) that contributes to the display is shown. When the configuration of the display device 10A is similar to the configuration of the display device 10, the explanation may be omitted.

In the display device 10A, the opening PCON is provided to extend along the first direction D1 the same as the display device 10. As shown in FIG. 27, the display device 10A differs from the display device 10 in that the common electrode CTCO is provided on the insulating layer IL5. Therefore, a detailed description of the configuration from the light-shielding layer LS to the insulating layer IL4 is omitted, since the description of the first embodiment (e.g., FIG. 5 to FIG. 8) can be referred to.

As shown in FIG. 28, the pattern of the slit SL of the common electrode CTCO in the area where the opening PCON is provided is different from the pattern of the slit SL of the common electrode CTCO shown in the first embodiment. In this embodiment, the common electrode CTCO is provided on the insulating layer IL5. In the opening PCON, since the insulating layer IL4 is not provided, the distance between the common electrode CTCO and the wiring W1 is close, and a parasitic capacitance is formed.

Therefore, it is preferable to remove the common electrode CTCO in the area overlapping the wiring W1 in the opening PCON. As a result, the common electrode CTCO does not overlap the wiring W1 in the opening PCON. More specifically, as shown in FIG. 28, the common electrode has an opening OPA in the area overlapping on the wiring W1 in the opening PCON, and the formation of the parasitic capacitance between the common electrode CTCO and the wiring W1 in the opening PCON is suppressed. In addition, by providing the opening OPA in the area overlapping on the wiring W1 in the opening PCON, adjacent slits SL1 and SL2 may be continuous in the fourth direction D4 that intersects the first direction D1 and the second direction D2.

As shown in FIG. 29, the connecting electrode ZTCO and the pixel electrode PTCO are connected in the opening PCON. The insulating layer IL5 is provided above the pixel electrode PTCO. The common electrode CTCO is provided above the insulating layer IL5. In other words, in the opening PCON, the common electrode does not overlap on the wiring W1 due to the opening OPA, but is opposite to the pixel electrode in the remaining portion via the insulating layer. As a result, a holding capacitance is formed by the pixel electrode PTCO, the insulating layer IL5, and the common electrode CTCO, while suppressing the formation of the parasitic capacitance between the common electrode and the wiring in the opening PCON. Above the common electrode CTCO, the filling member FM is provided to fill the opening PCON. The common auxiliary electrode CMTL is provided above the filling member FM.

Figure 30:
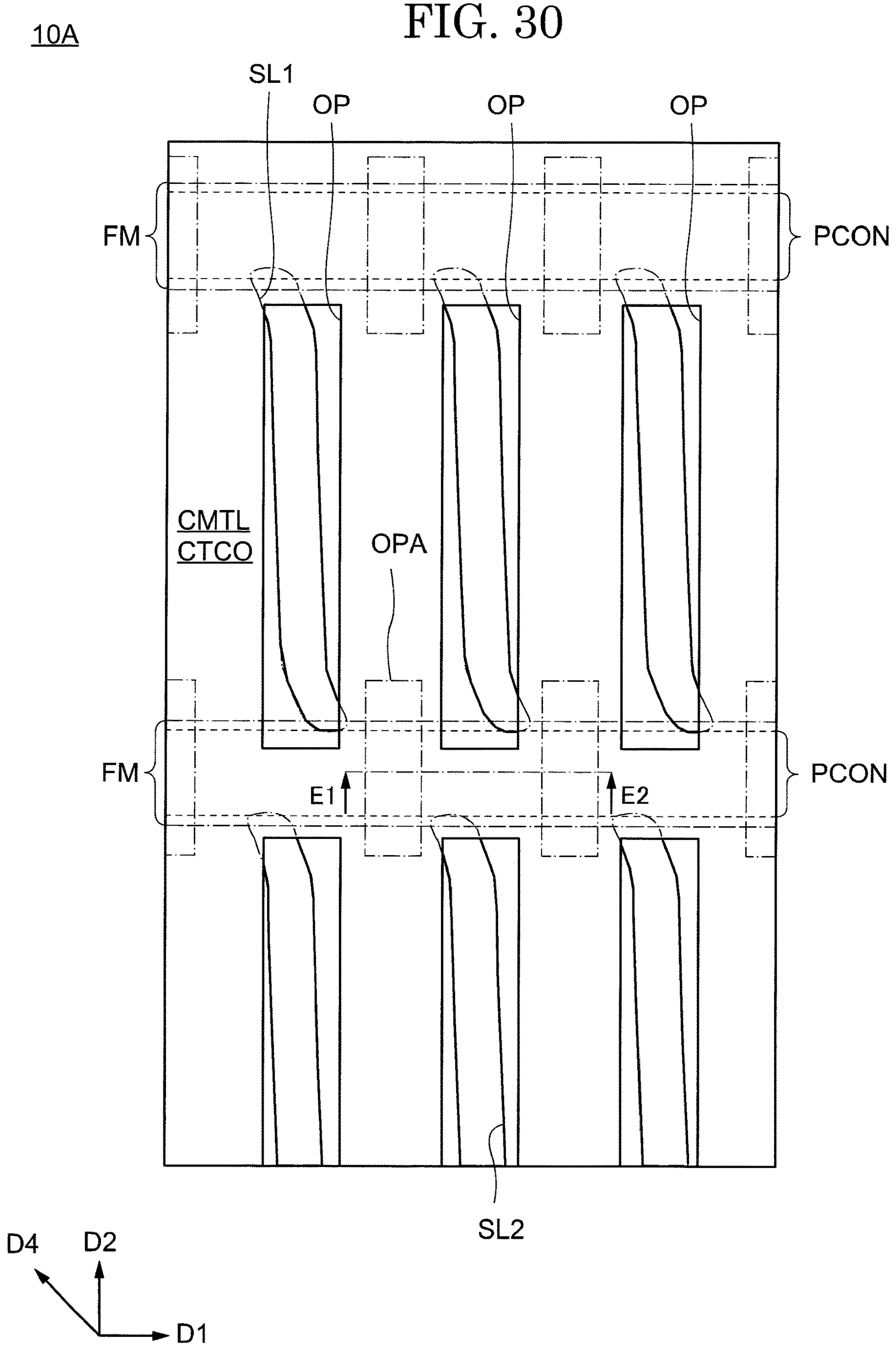
FIG. 30 is a plan view showing a configuration of a display device according to an embodiment of the present invention.

FIG. 30 shows an example in which the shape of the common electrode CTCO differs from that of the common electrode CTCO shown in FIG. 28. As shown in FIG. 30, the common electrode CTCO may be configured with the slits SL1 and SL2 and the opening OPA, each of which is provided independently. As shown in FIG. 30, the opening OPA is not continuous with the slits SL1 and SL2 in the fourth direction D4. The opening OPA may be provided along the direction D2. This can suppress the formation of the parasitic capacitance between the common electrode CTCO and the wiring W1.

Figure 31:
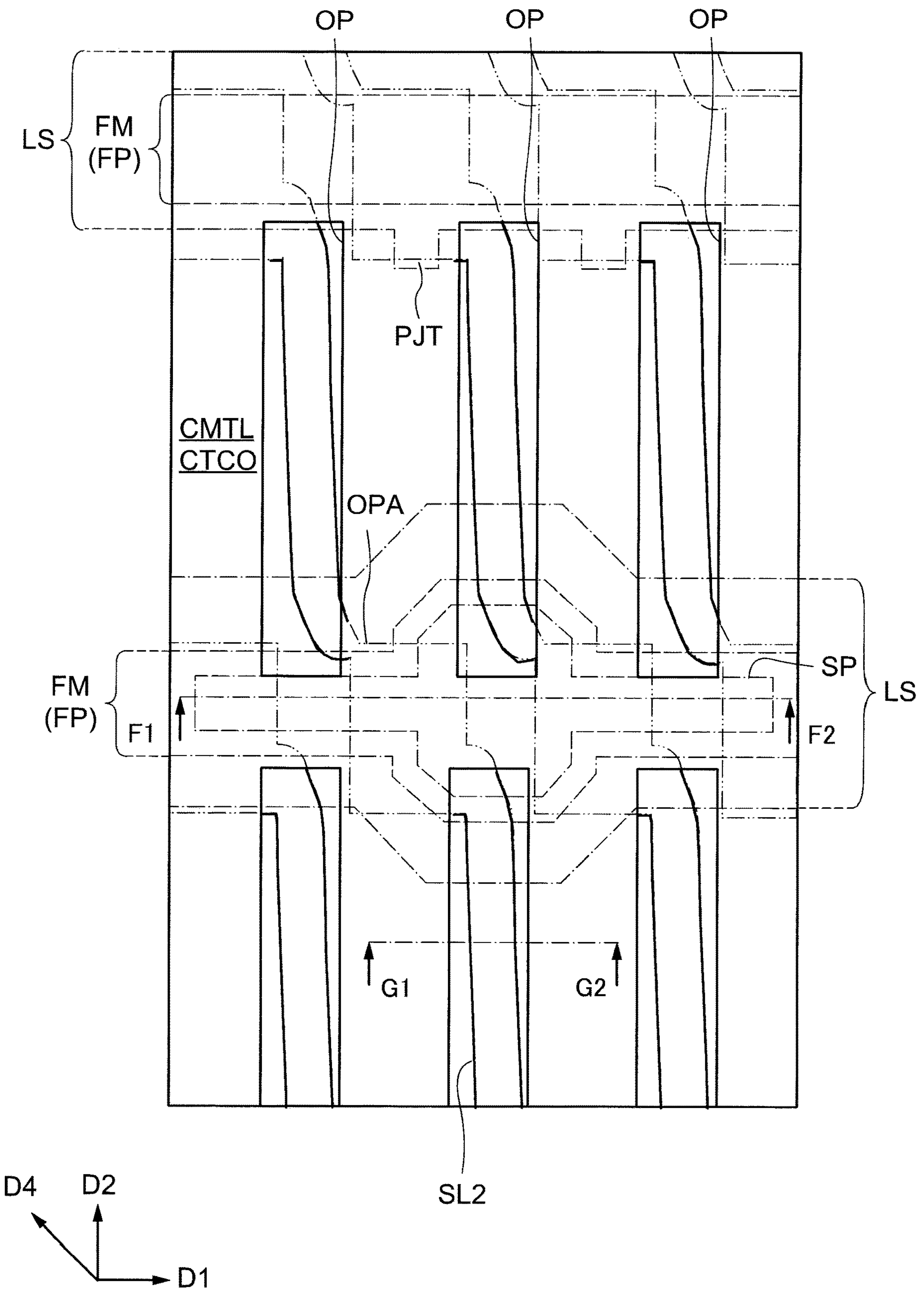
FIG. 31 is a plan view showing a configuration of a display device according to an embodiment of the present invention.
Figure 32:
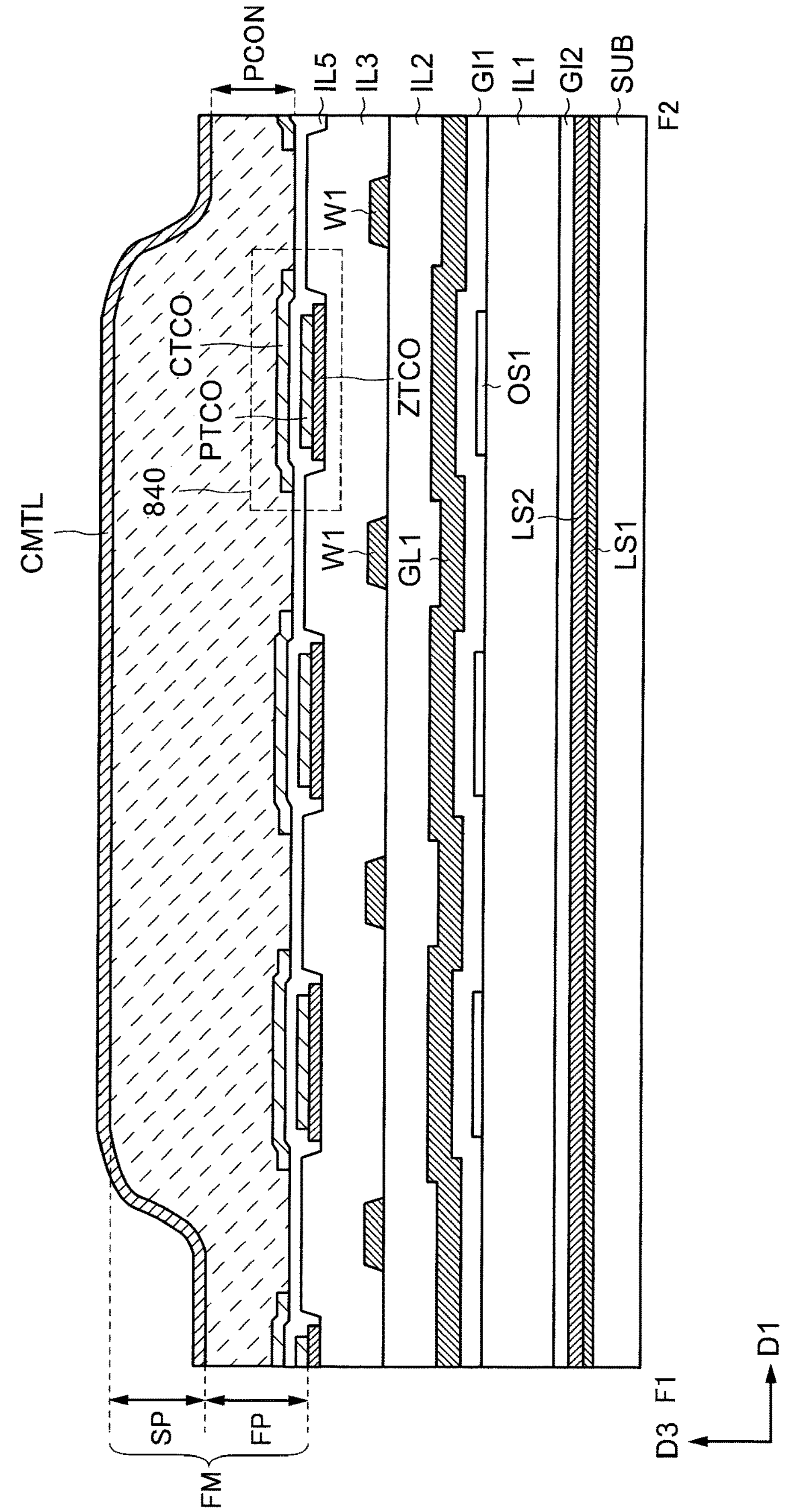
FIG. 32 is a cross-sectional view of the display device shown in FIG. 28 at the line F1-F2.
Figure 33:
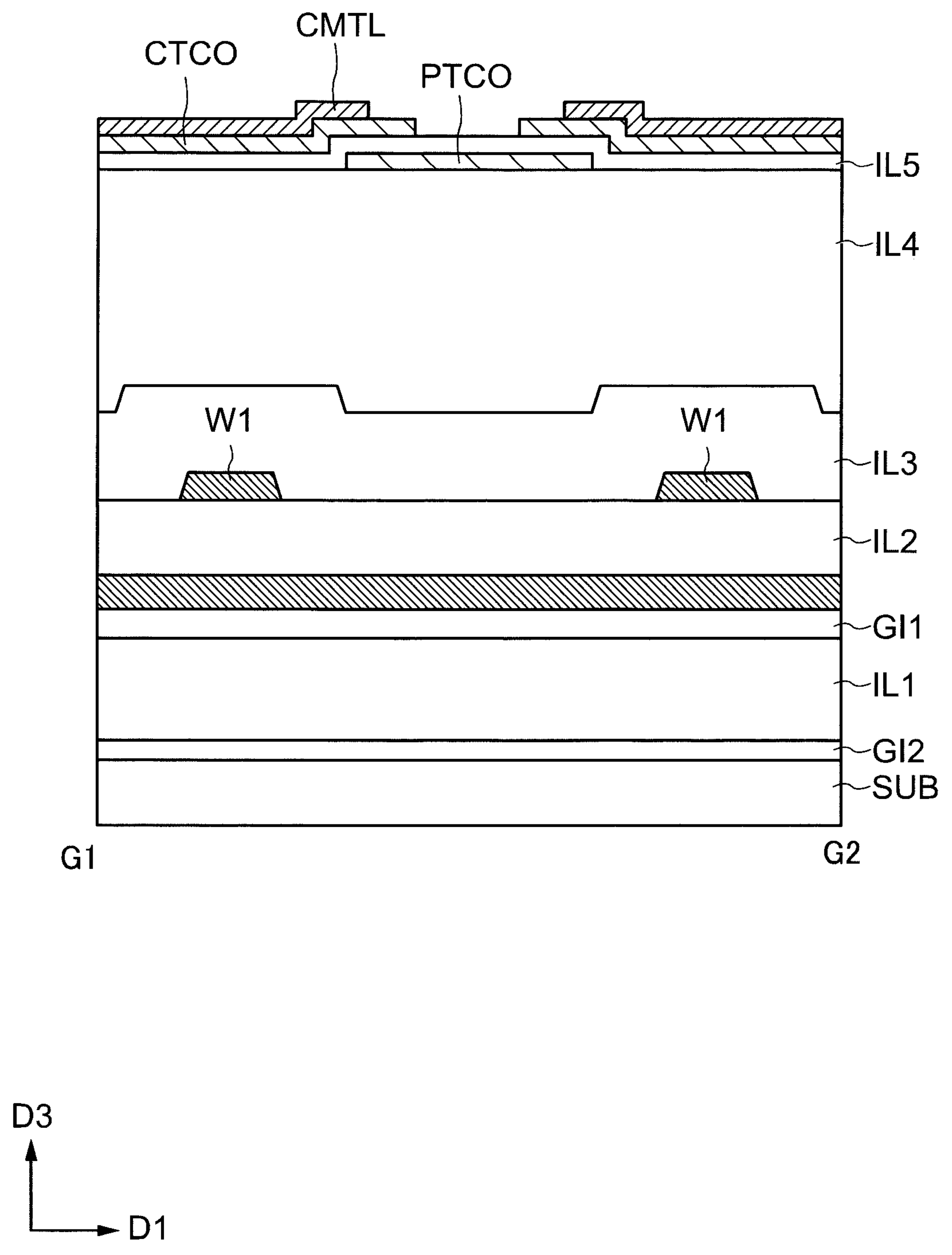
FIG. 33 is a cross-sectional view of the display device shown in FIG. 28 at the line G1-G2.

With reference to FIG. 31 to FIG. 34, the configuration of the spacer SP provided on the array substrate is described. FIG. 31 shows a plan view of the light-shielding layer LS, the filling member FM, the common electrode CTCO, and the common auxiliary electrode CMTL. FIG. 32 shows a cross-sectional view cut along the line F1-F2 shown in FIG. 30. FIG. 33 shows a cross-sectional view cut along the line G1-G2 shown in FIG. 30.

In FIG. 31, the common electrode CTCO is also provided on the insulating layer IL5. Therefore, it is preferable to remove the common electrode CTCO in the area overlapping the wiring W1 in the opening PCON. In other words, in the area where the opening PCON is not provided, the common electrode CTCO is provided so that it does not overlap the wiring W1. As shown in FIG. 30, by providing the opening OPA in the area overlapping the wiring W1 in the opening PCON, adjacent slits SL1 and SL2 may be continuous in the third direction that intersects the first direction D1 and the second direction D2.

As shown in FIG. 32, the insulating layer IL5 is provided above the pixel electrode PTCO and the insulating layer IL4. The insulating layer IL5 is also provided inside the opening PCON, on the side of the opening PCON and on the pixel electrode PTCO. The common electrode CTCO is provided above the insulating layer IL5. The filling member FM is provided to fill the interior of the opening PCON. Since the opening PCON is provided extending in the first direction D1, the filling member FM is also provided extending in the first direction D1. In the opening PCON, the wiring W1 can be prevented from overlapping on the common electrode CTCO. As a result, it is possible to suppress the formation of the parasitic capacitance in the area overlapping the wiring W1 in the opening PCON. In the area where the filling member FM is provided, the filling member FM has a protrusion (spacer SP) that protrudes above the top surface of the pixel electrode PTCO provided above the insulating layer IL4. The common auxiliary electrode CMTL is provided above the spacer SP of the filling member FM.

In the display device 10A of this embodiment, the holding capacitance of the pixel electrode PTCO, the insulating layer IL5, and the common electrode CTCO (common auxiliary electrode CMTL) in the opening area of pixel 310 can be added to the holding capacitance of the pixel electrode PTCO, the insulating layer IL5, and the common electrode CTCO in aperture PCON. CTCO and the common electrode CTCO in the opening PCON can be added. As a result, the retention capacitance can be increased in the display device 10A, and the influence of potential due to capacitive coupling can be reduced. Thus, in the display device 10A, the influence of the electric potential due to capacitive coupling can be reduced due to the reduced pixel size, and thus crosstalk can be reduced.

In this embodiment, as shown in FIG. 33, in the area where the filling member FM is not provided, the common electrode CTCO and the common auxiliary electrode CMTL are in contact with each other on the insulating layer IL4. For example, depending on the size of the opening provided in the common electrode CTCO, an isolated common electrode may be formed in the common electrode CTCO. However, in the area where the filling member FM is not provided, it is in contact with the common electrode CTCO and the common auxiliary electrode CMTL on the insulating layer IL4. The common auxiliary electrode CMTL can prevent the isolated common electrode from being electrically insulated.

Figure 34:
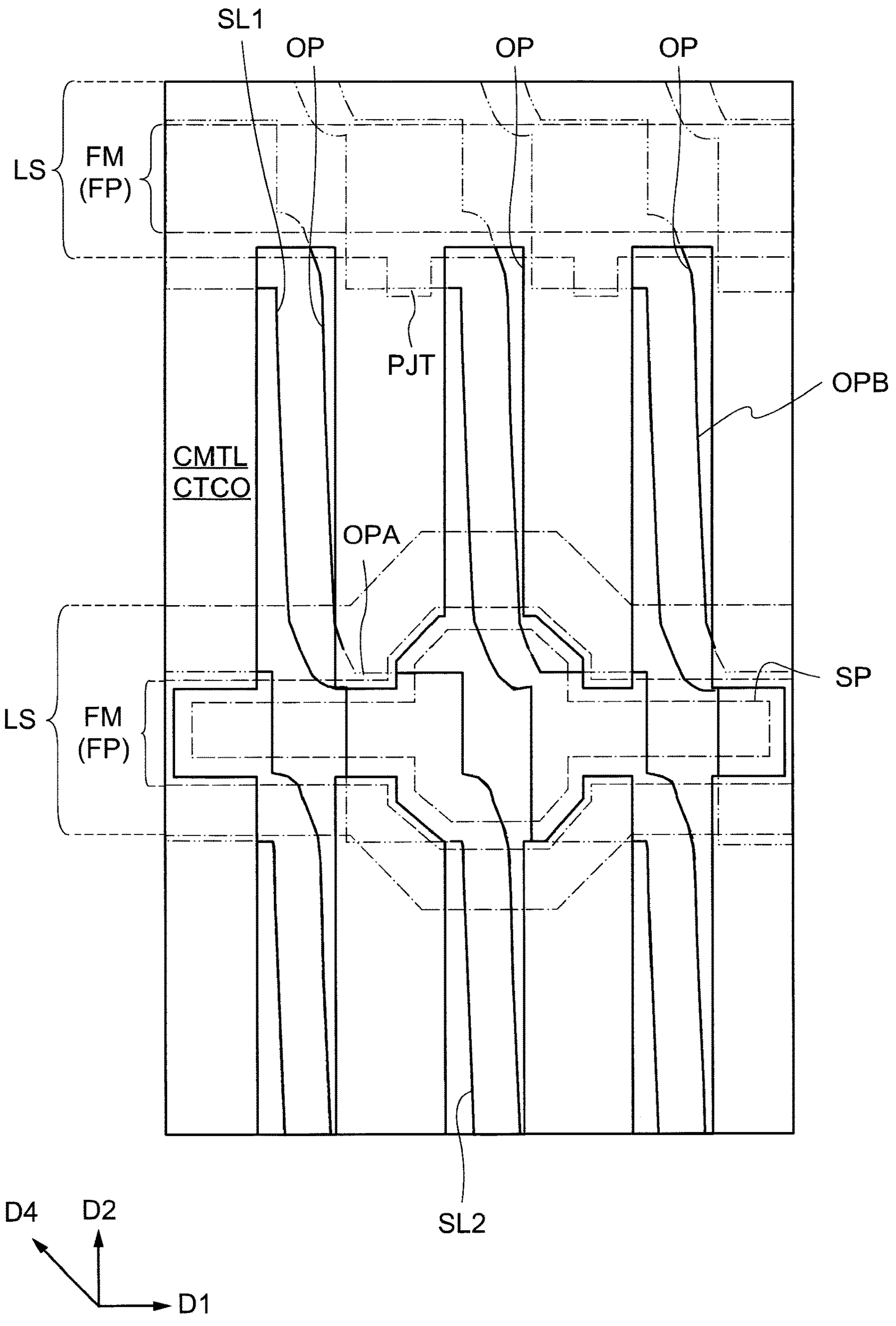
FIG. 34 is a plan view showing a configuration of a display device according to an embodiment of the present invention.

FIG. 34 shows the common auxiliary electrode CMTL having a pattern that is partly different from the pattern of the common auxiliary electrode CMTL shown in FIG. 30. As shown in FIG. 34, the pattern of the common auxiliary electrode CMTL in the area where the spacer SP is provided may be different from the pattern of the common auxiliary electrode CMTL in the area where the spacer SP is not provided (see FIG. 28). More specifically, as shown in FIG. 34, the common auxiliary electrode CMTL may have a configuration in which the common auxiliary electrode CMTL has an opening OPB at a position overlapping the filling member FM or the spacer SP and is connected to the opening OP around the opening OPB.

Each of the embodiments described above as embodiments of the present invention may be combined as appropriate, as long as they do not contradict each other. In addition, those in the art who have made additions, deletions, or design changes of components, or additions, omissions, or changes of conditions of processes, as appropriate, based on the display device of each embodiment are also included in the scope of the present invention as long as they have the gist of the invention.

It is understood that other effects different from the effects brought about by each of the embodiments described above, which are obvious from the description herein or which can be easily predicted by those skilled in the art, are naturally brought about by the present invention.

What is claimed is:

1. A display device comprising a plurality of pixels arranged in a matrix on a substrate along a first direction and a second direction intersecting the first direction,
each of the plurality of pixels comprises:
a transistor;
a first transparent conductive layer arranged over the transistor and electrically connected to the transistor;
a first insulating layer arranged over the first transparent conductive layer;
a second transparent conductive layer arranged in the first insulating layer and electrically connected to the first transparent conductive layer via an opening extending over the plurality of pixels arranged in line in the first direction;
a filling member arranged over the second transparent conductive layer to fill the interior of the opening;
a third transparent conductive layer arranged on the first insulating layer and the filling member; and
a metal layer in contact with the third transparent conductive layer,
wherein
the filling member has a protruding portion protruding above a top surface of the second transparent conductive layer arranged above the first insulating layer, and
the third transparent conductive layer and the metal layer are arranged on the protruding portion.

2. The display device according to claim 1, wherein the transistor has an oxide semiconductor layer, a gate wiring opposite the oxide semiconductor layer, and a gate insulating layer between the oxide semiconductor layer and the gate wiring, and the gate wiring extends along the first direction overlapping on the opening.

3. A display device comprising a plurality of pixels arranged in a matrix on a substrate along a first direction and a second direction intersecting the first direction,
each of the plurality of pixels comprises:
a transistor;
a first transparent conductive layer arranged over the transistor and electrically connected to the transistor;
a first insulating layer arranged over the first transparent conductive layer;
a second transparent conductive layer arranged in the first insulating layer and electrically connected to the first transparent conductive layer via an opening extending over the plurality of pixels arranged in line in the first direction;
a second insulating layer arranged over the second transparent conductive layer;
a third transparent conductive layer arranged over the second insulating layer;
a filling member arranged over the third transparent conductive layer to fill the interior of the opening; and
a metal layer in contact with the third transparent conductive layer and the filling member,
wherein
the filling member has a protrusion portion protruding above a top surface of the second transparent conductive layer arranged above the first insulating layer, and
the metal layer is arranged above the protruding portion.

4. The display device according to claim 3, wherein the transistor has an oxide semiconductor layer, a gate wiring opposite the oxide semiconductor layer, and a gate insulating layer between the oxide semiconductor layer and the gate wiring, the gate wiring extending along the first direction overlapping on the opening.

5. The display device according to claim 4, further comprising:

a light-shielding layer between the substrate and the oxide semiconductor layer, wherein the light-shielding layer extends along the first direction so as to overlap the opening.

* * * * *